(12) United States Patent
Honda et al.

(10) Patent No.: US 8,247,331 B2
(45) Date of Patent: Aug. 21, 2012

(54) METHOD FOR FORMING INSULATING FILM AND METHOD FOR MANUFACTURING SEMICONDUCTOR DEVICE

(75) Inventors: Minoru Honda, Amagasaki (JP); Yoshihiro Sato, Amagasaki (JP); Toshio Nakanishi, Amagasaki (JP)

(73) Assignee: Tokyo Electron Limited, Tokyo (JP)

( * ) Notice: Subject to any disclaimer, the term of this patent is extended or adjusted under 35 U.S.C. 154(b) by 490 days.

(21) Appl. No.: 12/521,645

(22) PCT Filed: Dec. 20, 2007

(86) PCT No.: PCT/JP2007/074482
§ 371 (c)(1),
(2), (4) Date: Aug. 12, 2009

(87) PCT Pub. No.: WO2008/081723
PCT Pub. Date: Jul. 10, 2008

(65) Prior Publication Data
US 2010/0323529 A1 Dec. 23, 2010

(30) Foreign Application Priority Data
Dec. 28, 2006 (JP) .................................. 2006-356082

(51) Int. Cl.
*H01L 21/318* (2006.01)
*H01L 21/321* (2006.01)

(52) U.S. Cl. .. 438/775; 438/786; 438/791; 257/E21.302

(58) Field of Classification Search ................... 438/775, 438/776, 786, 791
See application file for complete search history.

(56) References Cited

U.S. PATENT DOCUMENTS

| 6,037,205 | A * | 3/2000 | Huh et al. ..................... 438/240 |
| 6,399,520 | B1 * | 6/2002 | Kawakami et al. ........... 438/778 |
| 6,470,824 | B2 * | 10/2002 | Kawakami et al. .... 118/723 AN |
| 6,767,847 | B1 * | 7/2004 | Hu et al. ....................... 438/771 |
| 7,723,241 | B2 * | 5/2010 | Matsuyama et al. .......... 438/776 |
| 7,737,005 | B2 * | 6/2010 | Tada et al. ..................... 438/477 |
| 7,897,518 | B2 * | 3/2011 | Matsuyama et al. .......... 438/776 |
| 7,960,293 | B2 * | 6/2011 | Honda et al. .................. 438/776 |
| 7,993,705 | B2 * | 8/2011 | Nodera et al. .......... 427/255.394 |
| 8,067,772 | B2 * | 11/2011 | Ikeda et al. ..................... 257/59 |
| 2003/0042557 | A1 * | 3/2003 | Shimamoto et al. .......... 257/406 |
| 2005/0064667 | A1 * | 3/2005 | Matsushita et al. ........... 438/287 |
| 2007/0059944 | A1 * | 3/2007 | Matsuyama et al. .......... 438/775 |

(Continued)

FOREIGN PATENT DOCUMENTS
JP 10 135207 5/1998
(Continued)

*Primary Examiner* — David Vu
*Assistant Examiner* — Earl Taylor
(74) *Attorney, Agent, or Firm* — Oblon, Spivak, McClelland, Maier & Neustadt, L.L.P.

(57) ABSTRACT

A method for forming an insulating film includes a step of preparing a substrate, which is to be processed and has silicon exposed on the surface; a step of performing first nitriding to the silicon exposed on the surface of the substrate, and forming a silicon nitride film having a thickness of 0.2 nm but not more than 1 nm on the surface of the substrate; and a step of performing first heat treatment to the silicon nitride film in $N_2O$ atmosphere and forming a silicon nitride film. This method may further include a step of performing second nitriding to the silicon oxynitride film, and furthermore, may include a step of performing second heat treatment to the silicon oxynitride film after the second nitriding.

16 Claims, 17 Drawing Sheets

U.S. PATENT DOCUMENTS

| | | | |
|---|---|---|---|
| 2007/0257372 A1* | 11/2007 | Tada et al. | 257/763 |
| 2008/0000551 A1* | 1/2008 | Sato et al. | 148/222 |
| 2008/0128703 A1* | 6/2008 | Ikeda et al. | 257/66 |
| 2008/0226823 A1* | 9/2008 | Hasegawa | 427/255.394 |
| 2009/0197403 A1* | 8/2009 | Honda et al. | 438/585 |
| 2010/0196627 A1* | 8/2010 | Matsuyama et al. | 427/569 |
| 2010/0323529 A1* | 12/2010 | Honda et al. | 438/777 |
| 2011/0124202 A1* | 5/2011 | Matsuyama et al. | 438/776 |

FOREIGN PATENT DOCUMENTS

| | | |
|---|---|---|
| JP | 2001 274148 | 10/2001 |
| JP | 2005 93865 | 4/2005 |
| JP | 2006 319091 | 11/2006 |
| WO | 2005 086215 | 9/2005 |
| WO | WO 2005086215 A1 * | 9/2005 |
| WO | WO 2005098913 A1 * | 10/2005 |

\* cited by examiner

METHOD FOR FORMING INSULATING FILM AND METHOD FOR MANUFACTURING SEMICONDUCTOR DEVICE

FIELD OF THE INVENTION

The present invention relates to a method for forming an insulating film by performing nitriding and oxidation on a substrate to be processed, such as a semiconductor substrate, and a method for manufacturing a semiconductor device including a process of forming the insulating film thereby.

BACKGROUND OF THE INVENTION

In a process of manufacturing various semiconductor devices, a silicon nitride film is formed as, e.g., a gate insulating film of a transistor. In order to form such a silicon nitride film, in addition to a method of depositing a silicon nitride film by chemical vapor deposition (CVD), for example, a method of forming a silicon oxynitride film by introducing nitrogen into a silicon oxide film through a plasma process has been proposed (see, e.g., Japanese Patent Laid-open Publication No. 2001-274148: Patent Document 1).

Recently, as the gate insulating film becomes increasingly thinner in association with miniaturization of a semiconductor device, formation of a thin gate insulating film having a film thickness of several nm is required. On this account, formation of a silicon nitride film through direct nitriding of silicon has been actively studied.

As a method for forming a gate insulating film by introducing nitrogen directly to a silicon substrate, there is proposed a method for forming the gate insulating film, wherein the method includes a step of forming a first nitride film on the semiconductor substrate, a step of forming a first oxide layer between the semiconductor substrate and the first nitride film as well as simultaneously forming a second oxide layer on the first nitride film, and a step of forming a second nitride film or an oxynitride film on the first nitride film by carrying out nitriding of the second oxide layer, in order to render uniform the film thickness of the gate insulating film to reduce an equivalent oxide thickness (EOT) (see, e.g., Japanese Patent Laid-open Publication No. 2005-93865: Patent Document 2).

In the above method of Patent Document 2, the silicon nitride film is formed by carrying out direct nitriding of the silicon substrate. Then, oxidation and nitriding are performed to thereby form the silicon oxide layer, the first silicon nitride film, and the second silicon nitride film (or the silicon oxynitride film) on the interface of the silicon substrate.

However, in case of the gate insulating film formed by the method disclosed in Patent Document 2, due to interface states and fixed charges being developed, threshold voltage is varied and flat band voltage (Vfb) is increased, thereby negatively influencing upon mobility of electrons or holes in a transistor. In accordance with the method of Patent Document 2, it is difficult to form a high quality gate insulating film having excellent electrical characteristics on the transistor.

SUMMARY OF THE INVENTION

It is an object of the present invention to provide a method for forming an insulating film, capable of forming a high quality thin insulating film by carrying out direct nitriding of silicon.

It is another object of the present invention to provide a method for manufacturing a semiconductor device including the method for forming an insulating film.

In accordance with a first aspect of the present invention, there is provided a method for forming an insulating film comprising: preparing a substrate to be processed, in which silicon is exposed on a surface of the substrate; performing a first nitriding process on the silicon to form a silicon nitride film having a film thickness ranging from 0.2 to 1 nm on a surface of the silicon; and performing a first thermal process on the silicon nitride film in an $N_2O$ atmosphere to form a silicon oxynitride film.

In the first aspect, the method may further include performing a second nitriding process on the silicon oxynitride film, after the first nitriding process is performed. Further, the method may further include performing a second thermal process on the silicon oxynitride film after the second nitriding process is performed.

Further, in the first aspect, the first thermal process may be performed at a temperature within a range between 1,000 and 1,200° C. The first nitriding process may be performed by using a plasma of rare gas and gas containing nitrogen. Further, the second nitriding process may be performed by using a plasma of rare gas and gas containing nitrogen.

The first nitriding process may be performed by using a plasma containing nitrogen formed by introducing a microwave into a process chamber through a planar antenna having a plurality of slots. The first nitriding process may be performed by interposing a dielectric plate having a plurality of through holes between the substrate to be processed loaded in the process chamber and a plasma generating region.

Further, the first thermal process may be carried out in an atmosphere of a gaseous mixture containing $N_2O$ and $N_2$ or an $N_2O$ gas atmosphere. In this case, a process pressure may range from 133.3 to 1,333 Pa, and a process temperature may range from 900 to 1,200° C. Further, the flow rate of $N_2O$ gas may range from 50 to 6,000 mL/min(sccm) and the flow rate of $N_2$ gas may range from 0 to 3,000 mL/min(sccm).

The second thermal process may be performed in an $N_2$ gas atmosphere, an $O_2$ gas atmosphere, or an atmosphere of a gaseous mixture containing $N_2$ and $O_2$. A process pressure may range from 133.3 to 1,333 Pa, and a process temperature may range from 800 to 1,200° C.

In accordance with a second aspect of the present invention, there is provided a method for manufacturing a semiconductor device comprising: forming an insulating film including preparing a substrate to be processed, in which silicon is exposed on a surface of the substrate, performing a nitriding process on the silicon to form a silicon nitride film having a film thickness ranging from 0.2 to 1 nm on a surface of the silicon, and performing a thermal process on the silicon nitride film in an $N_2O$ atmosphere to form a silicon oxynitride film; and forming semiconductor device elements on the substrate.

In accordance with a third aspect of the present invention, there is provided a storage medium, storing a program which runs on a computer and, when executed, controls a substrate processing system including a nitriding unit and a heat treating unit to perform a method for forming an insulating film, the method comprising: preparing a substrate to be processed, in which silicon is exposed on a surface of the substrate; performing a nitriding process on the silicon to form a silicon nitride film having a film thickness ranging from 0.2 to 1 nm on a surface of the silicon; and performing a thermal process on the silicon nitride film in an $N_2O$ atmosphere to form a silicon oxynitride film.

In accordance with a fourth aspect of the present invention, there is provided a substrate processing system comprising: a nitriding unit for performing a nitriding process on silicon of a substrate to be processed; a heat treating unit for performing a thermal process on the substrate; and a controller for controlling the nitriding unit and the heat treating unit such that the nitriding process is performed on silicon of the substrate, in which the silicon is exposed on a surface of the substrate, to form a silicon nitride film having a film thickness ranging from 0.2 to 1 nm on the silicon surface, and the thermal process is performed on the silicon nitride film in an $N_2O$ atmosphere to form a silicon oxynitride film.

In accordance with the aspects of the present invention, since a silicon nitride film having a film thickness ranging from 0.2 to 1 nm is formed by carrying out nitriding on silicon on the surface of a substrate to be processed and a silicon oxynitride film is formed by carrying out thermal oxidation on the silicon nitride film in an $N_2O$ atmosphere, fixed charges in the silicon oxynitride film are reduced, and when the silicon oxynitride film is used as a gate insulating film of a transistor, flat band voltage (Vfd) is suppressed to a small value, thereby achieving excellent characteristics of on current (Ion).

That is, the flat band voltage (Vfd) is lowered by forming the silicon nitride film having a thin film thickness ranging from 0.2 to 1 nm on the surface of the substrate by carrying out nitriding of silicon, thereby improving the characteristics of the on current (Ion). Further, although the silicon nitride film having a thin film thickness is obtained, leakage current is reduced by increasing a nitrogen concentration near the surface of the silicon oxynitride film in the second nitriding process.

Therefore, when the insulating film formed by the method in accordance with the present invention is used as a gate insulating film of a transistor, the gate insulating film will have excellent electrical characteristics. Accordingly, the method in accordance with the aspects of the present invention is advantageously used in the formation of a thin gate insulating film having a film thickness less than 1 nm in a process of manufacturing a semiconductor device, thereby facilitating miniaturization thereof.

DETAILED DESCRIPTION OF THE EMBODIMENTS

Hereinafter, embodiments of the present invention will be described in detail with reference to the accompanying drawings.

Figure 1:
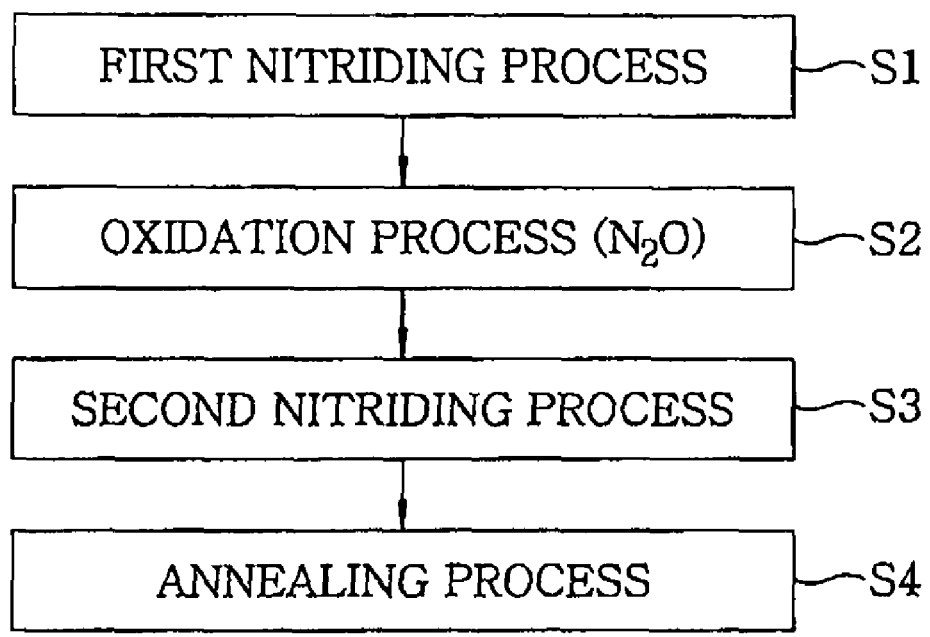
FIG. 1 is a flowchart illustrating a method for forming an insulating film in accordance with an embodiment of the present invention.
Figure 2:
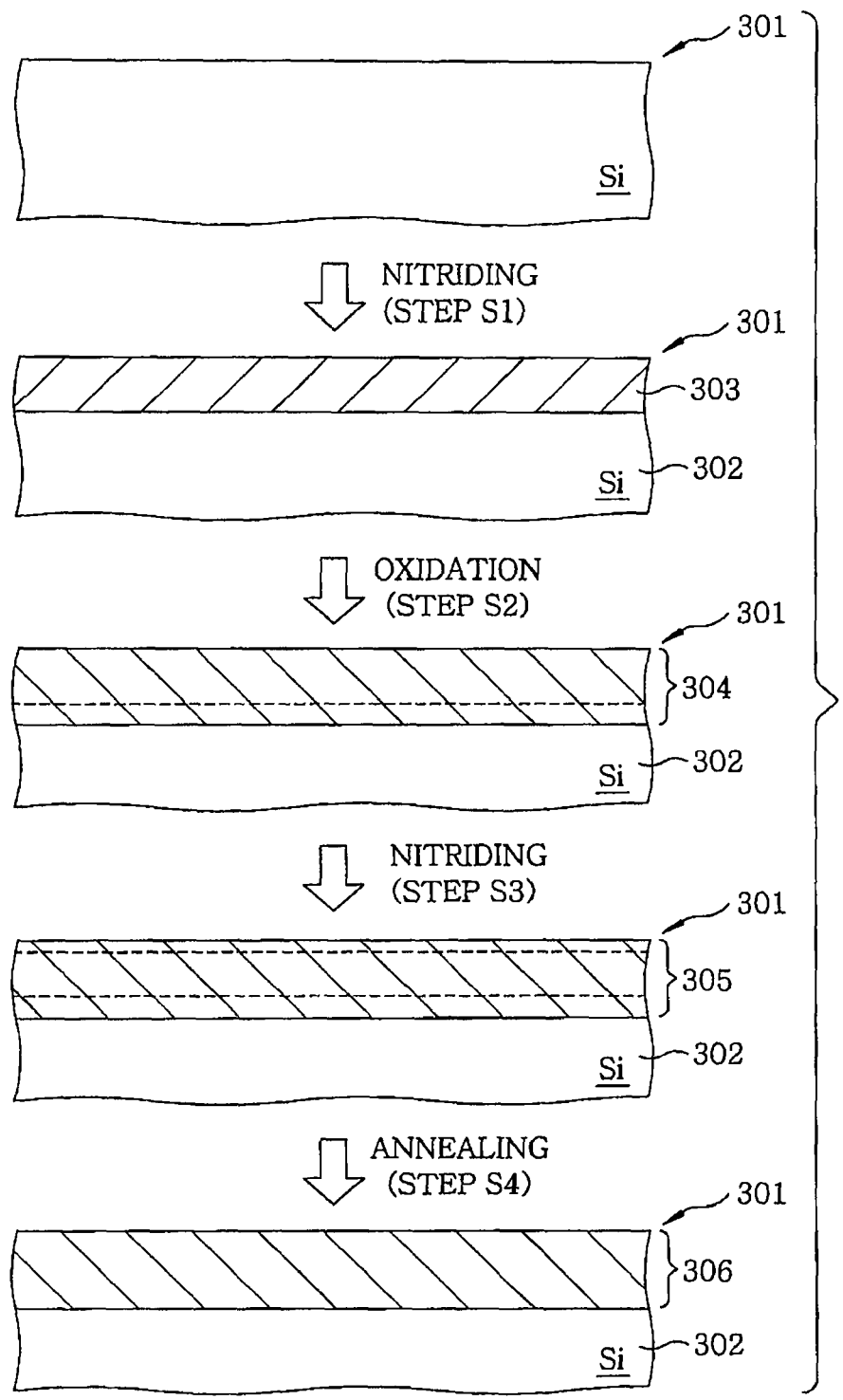
FIG. 2 is cross sectional views illustrating respective processes corresponding to steps S1 to S4 shown in FIG. 1.

FIG. 1 is a flow chart showing a method for forming an insulating film in accordance with an embodiment of the present invention. FIG. 2 is cross sectional views showing respective processes of step S1 to step S4 shown in FIG. 1.

Figure 3:
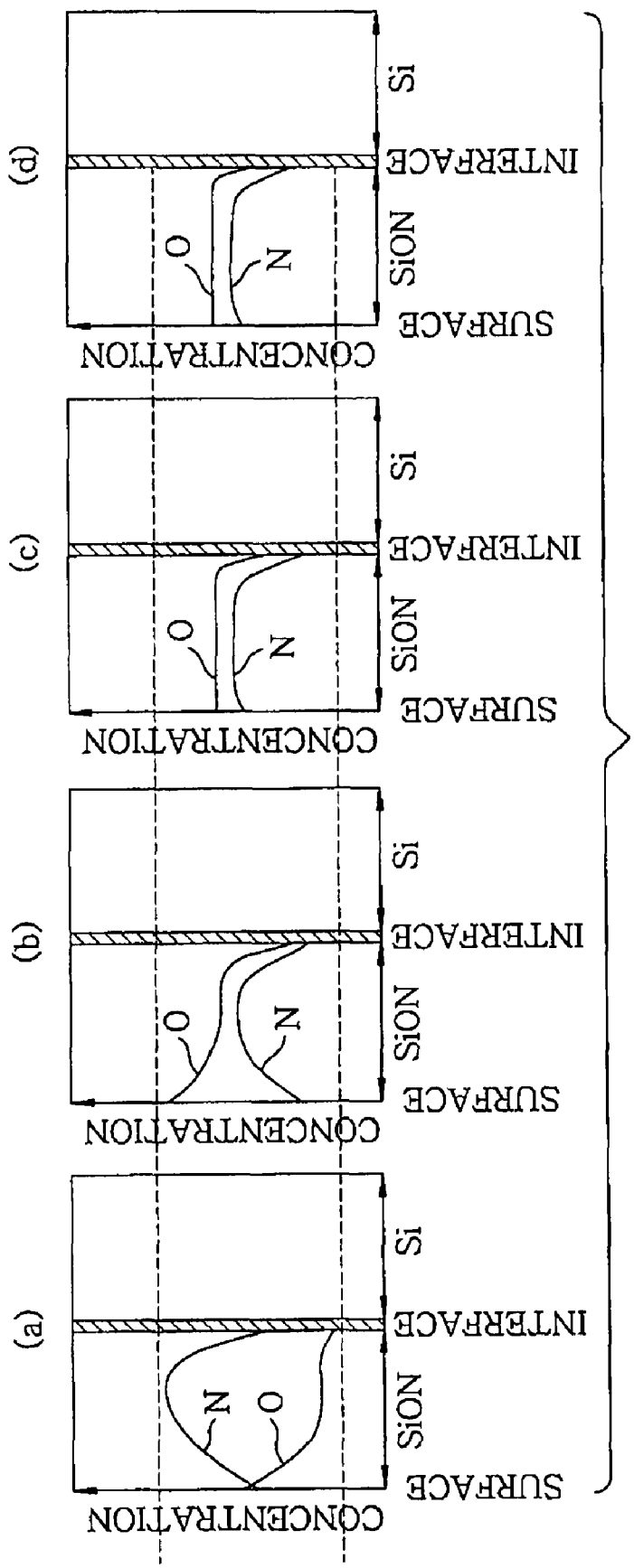
FIG. 3 illustrates profiles of nitrogen and oxygen in insulating films corresponding to the respective processes of steps S1 to S4 shown in FIG. 1.

FIG. 3 illustrates profiles of nitrogen (N) and oxygen (O) in insulating films in the depth direction after the respective processes. Here, formation of an insulating film applicable to a gate insulating film of a transistor will be exemplarily described.

Figure 5:
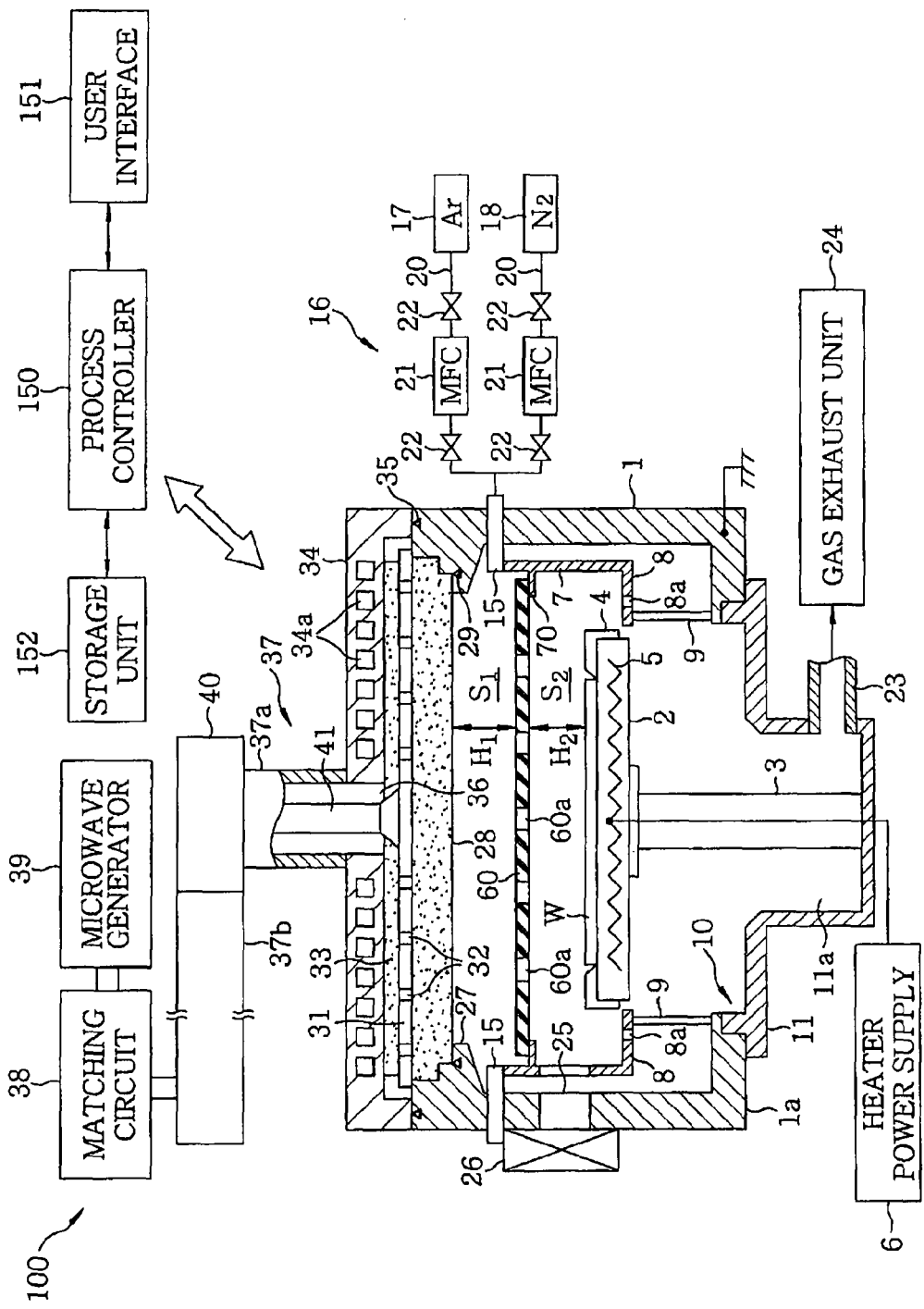
FIG. 5 schematically shows a cross sectional view of a plasma nitriding unit for performing nitriding of silicon, which is included in the substrate processing system shown in FIG. 4.

First, nitriding is performed on a silicon substrate 301 such as a semiconductor wafer (hereinafter, simply referred to as a 'wafer') (step S1: first nitriding process). Consequently, a silicon nitride film (SiN film) 303 having a film thickness ranging from 0.2 to 1 nm, preferably from 0.5 to 0.9 nm, and more preferably from 0.5 to 0.7 nm is formed on a silicon layer 302 of the silicon substrate 301. The nitriding of step S1 may be carried out through several methods, e.g., thermal processing and plasma processing, but it is not limited thereto. However, it is preferable that plasma nitriding is carried out by using a plasma processing apparatus 100 (to be described later) capable of processing a target by using a plasma of a high density, a low electron temperature, and a low ion energy, as shown in FIG. 5, from the viewpoint of the formation of the silicon nitride film 303 having an ultra-thin thickness less than 1 nm almost without plasma damage.

When the plasma nitriding is carried out by using the plasma processing apparatus, the flow rate of rare gas, e.g., Ar gas, is set to range from 100 to 6,000 mL/min(sccm), and the flow rate of $N_2$ gas is set to range from 10 to 2,000 mL/min (sccm). In this case, the flow rate ratio of Ar to $N_2$ (Ar/$N_2$) range from 0.5 to 600, preferably from 2 to 200. Further, an inner pressure of a chamber is adjusted to range from 66.7 to 1,333 Pa (from 0.05 to 10 Torr), preferably from 200 to 667 Pa (from 1.5 to 5 Torr), and more preferably from 200 to 266.6 Pa (from 1.5 to 2 Torr), and the wafer W is heated to a temperature ranging from 300 to 800° C., preferably from 400 to 800° C., and more preferably from 600 to 800° C. Preferably, the microwave power is set to range from 500 to 2,000 W. Further, if a plate 60 (to be described later) is not provided, the process pressure is preferably adjusted to range from 133.3 to 1,333 Pa (1 to 10 Torr). In the first nitriding process of step S1, the nitriding is carried out under the condition that a plasma mainly containing radicals is generated. Accordingly, there is no damage to the film and the substrate.

The silicon nitride film may be controlled to have a desired film thickness by adjusting, the temperature, the pressure, and the microwave power among the above conditions, and may be controlled by adjusting the process time. Further, the film thickness of the silicon nitride film may be controlled by suppressing supply of ions by providing a plate made of, e.g., quartz in a space within the chamber, the plate having a plurality of uniformly arranged holes.

When step S1 is completed, N atoms, N being a relatively large number, are present on the interface between the silicon nitride film 303 and the silicon layer 302, as shown in (a) of FIG. 3. However, since the physical film thickness of the silicon nitride film 303 is ultra thin, i.e., less than 1 nm, preferably ranging from 0.5 to 0.7 nm, flat band voltage (Vfb) in a transistor or a capacitor using the silicon nitride film 303 is limited to a small value. Thus, a high transconductance (Gm) and high on current (Ion) can be obtained. However, in the above ultra-thin film condition, leakage current is inevitably increased.

Figure 9:
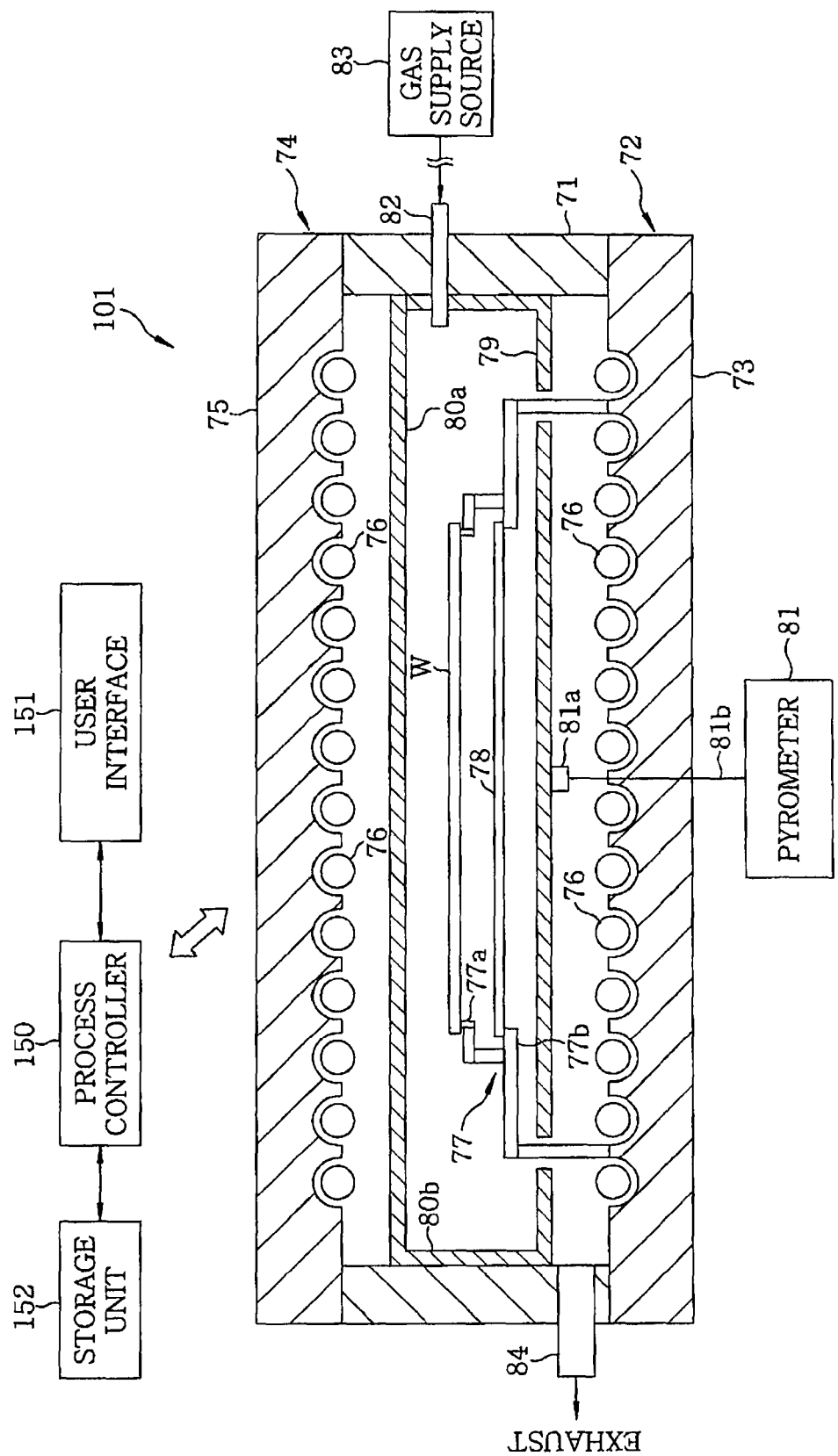
FIG. 9 schematically illustrates a cross sectional view showing one example of a heat treating unit used in the substrate processing system shown in FIG. 4.

Thereafter, the silicon substrate 301 having the silicon nitride film 303 formed thereon is oxidized by using a heat treating unit 101 (to be described later), as shown in FIG. 9 (thermal oxidation process: first annealing process) (step S2). Consequently, oxygen is introduced into the silicon nitride film 303, thereby forming a silicon oxynitride film (SiON film) 304 having a concentration gradient in which an oxygen concentration decreases from the surface of the silicon oxynitride film 304 toward the interface between the silicon oxynitride film 304 and the silicon layer 302. The above oxidation is carried out by using a gas mixture including $N_2O$ gas and $N_2$ gas, or $N_2O$ gas. In this case, it is preferable that the flow rate of $N_2O$ gas ranges from 50 to 6,000 mL/min(sccm), the flow rate of $N_2$ gas is set to range from 0 to 3,000 mL/min (sccm), and the partial pressure of $N_2O$ gas is set to range from 3.3 to 133.3 Pa. Further, the thermal oxidation is preferably carried out at a process pressure ranging from 133.3 to 13,333 Pa and a process temperature within a range from 900 to 1,200° C. for about from 0.1 to 2 minutes. The higher the process temperature is, the more effectively the thermal oxidation is carried out. That is, the process temperature is preferably 1,000° C. or more, and more preferably between 1000 and 1,200° C.

The surface of the silicon oxynitride film 304, obtained by carrying out the thermal oxidation at a high temperature within 1,000 to 1,200° C. in an $N_2O$ gas atmosphere, is oxidized. Accordingly, as shown in (b) of FIG. 3, oxygen is entirely increased in the thickness direction, and thus a nitrogen concentration is substantially lowered. The nitrogen concentration in the film 304 shows a profile that increases in the depth direction toward the interface between the film 304 and the silicon layer 302 and that on the interface between the film 304 and the silicon layer 302 is lowered, in the same way as the profile of (a) of FIG. 3. However, the profile of the nitrogen concentration is entirely lower than the profile of (a) of FIG. 3. On the other hand, an oxygen concentration is generally decreased from the surface of the silicon oxynitride film 304 to the interface between the silicon oxynitride film 304 and the silicon layer 302, and thus has a same profile as that of (a) of FIG. 3. However, this oxygen concentration is entirely higher than the oxygen concentration of (a) of FIG. 3, and oxygen of a higher level than that of (a) of FIG. 3 is introduced into the interface. In the silicon oxynitride film 304 having these nitrogen/oxygen profiles, since nitrogen atoms are distant from the interface due to formation of Si—O at the interface, fixed charges in the insulating film can be reduced.

That is, interface states are reduced and flat band voltage (Vfb) is suppressed by change from Si—SiN to Si—SiO, and leakage current is reduced. Further, a threshold voltage (Vth) shift in the transistor is improved and excellent transconductance (Gm) and excellent characteristics of the on current (Ion) are achieved.

By performing the first nitriding process of step S1 and the oxidation process of step S2, high transconductance (Gm) is obtained, thereby forming an insulating film having a suppressed leakage current and flat band voltage (Vfb), and excellent electrical characteristics. However, in addition to the processes of steps S1 and S2, a second nitriding process (step S3) may be carried out. Consequently, the leakage current and flat band voltage (Vfb) are further reduced. Moreover, in addition to the processes of step S1, step S2, and step S3, an annealing process (step S4) may be carried out. By carrying out the processes of steps S1 to S3 or steps S1 to S4, it is possible to form an insulating film having more excellent electrical characteristics than those of the insulating film obtained by carrying out the processes of steps S1 and S2.

In step S3, for example, the plasma nitriding is carried out only on the surface of the silicon oxynitride film (SiON film) 304 by using the plasma processing apparatus 100 (to be described later) shown in FIG. 5 (second nitriding process). By the second nitriding of step S3, nitrogen is newly introduced into the surface (up to, e.g., 0.5 nm in the depth direction) of the silicon oxynitride film 304, and a silicon oxynitride film 305 having the profile of a more uniform nitrogen concentration in the thickness direction, as shown in (c) of FIG. 3, is formed by increasing the nitrogen concentration at the surface of the silicon oxynitride film 304, compared to that obtained after step S2 has been completed (see (b) of FIG. 3). By increasing the nitrogen concentration near the surface of the film, a threshold voltage (Vth) shift in the transistor is suppressed, and the leakage current is reduced under the condition that high transconductance (Gm) and high on current (Ion) are maintained. Further, by increasing the nitrogen concentration in the film, the penetration of boron into the film is prevented, and the reliability of a semiconductor device is improved.

If the nitriding of the surface of the substrate is carried out by using the plasma processing apparatus, the flow rate of rare gas, e.g., Ar gas, is set to range from 100 to 6,000 mL/min (sccm), and the flow rate of $N_2$ gas is set to range from 5 to 2,000 mL/min(sccm). In this case, the flow rate ratio of Ar to $N_2$ ($Ar/N_2$) falls between 0.5 and 600, preferably between 2 and 200. Further, the inner pressure of the chamber is adjusted to range from 0.66 to 1,333 Pa (5 mTorr to 10 Torr), preferably from 1.33 to 26.6 Pa (5 mTorr to 0.2 Torr), and more preferably from 1.33 to Pa (5 to 90 mTorr), and the wafer W is heated to a temperature between 200 and 600° C., preferably between 200 and 400° C., and more preferably between 300 and 400° C. Further, the microwave power is preferably set to fall between 500 and 2,000 W.

Further, if the plate 60 is not provided, the process pressure is preferably adjusted to be within a range from 6.6 to 26.6 Pa (0.05 to 0.2 Torr).

In the second nitriding process of step S3, the nitriding is preferably carried out under the condition that a plasma mainly containing ions is generated. This plasma preferably has a low electron temperature within a range from 0.5 to 2 [eV] and a high density ranging from $1 \times 10^{10}/cm^3$ to $5 \times 10^{12}/cm^3$.

By carrying out the above processes of steps S1 to S3, nitrogen of a regular level is introduced into the silicon layer 302 in the thickness direction from the surface of the silicon substrate 301 toward the interface with the silicon layer 302, thereby forming the silicon oxynitride film 305 having a profile of the nitrogen concentration, in which the nitrogen concentration decreases in the depth direction around the interface.

In step S4, the annealing is carried out to increase the density of the silicon oxynitride film 305 to thereby improve insulating characteristics. This annealing is carried out by using the heat treating unit 101 shown in FIG. 9. The annealing may be carried out in an atmosphere of $N_2$ gas, $N_2O$ gas, $O_2$ gas, or a gas mixture thereof, preferably in an atmosphere of $N_2$ gas, $O_2$ gas, or a gas mixture of $N_2$ and $O_2$. Here, it is preferable that the flow rate of $N_2$ gas, $N_2O$ gas, or $O_2$ gas ranges from 100 to 6,000 mL/min(sccm). The process pressure is preferably 66.7 Pa or more, and more preferably from 133.3 to 1,333 Pa, and the process temperature ranges from preferably 800 to 1,200° C., and more preferably from 800 to 1,000° C. The process time ranges preferably from about 0.5 to 2 minutes. After the annealing of step S4 is completed, the profiles of nitrogen and oxygen in the depth direction in an insulating film 306 are scarcely changed, compared to the profiles of nitrogen and oxygen obtained after step S3 is completed (see (c) of FIG. 3). However, since defect portions in Si—N bonds in the insulating film are recovered by the annealing, temporal N release is reduced, and a silicon oxynitride film, which is dense and has a good quality, is formed. In this case, if the annealing process is carried out in any one of an oxidation atmosphere and a nonreactive atmosphere under the atmospheric pressure at a temperature of about 1,000° C., the annealing is excessively achieved and oxygen and nitrogen are not controlled to have desired profiles. Therefore, the annealing process is preferably carried out under a reduced pressure ranging from 133.3 to 1,333 Pa.

By the above processes of steps S1 to S4, the insulating film 306 having the total film thickness less than 1 nm, preferably from 0.5 to 1 nm, more preferably from 0.5 to 0.7 nm is manufactured. The insulating film 306 has reduced fixed charges and interface states and low flat band voltage (Vfb). Thus, the insulating film 306 has excellent electrical characteristics, i.e., excellent characteristics of the on current (Ion), high transconductance (Gm), almost no threshold voltage (Vth) shift, and a low leakage current, when the insulating film 306 is used as a gate insulating film of a transistor.

Figure 4:
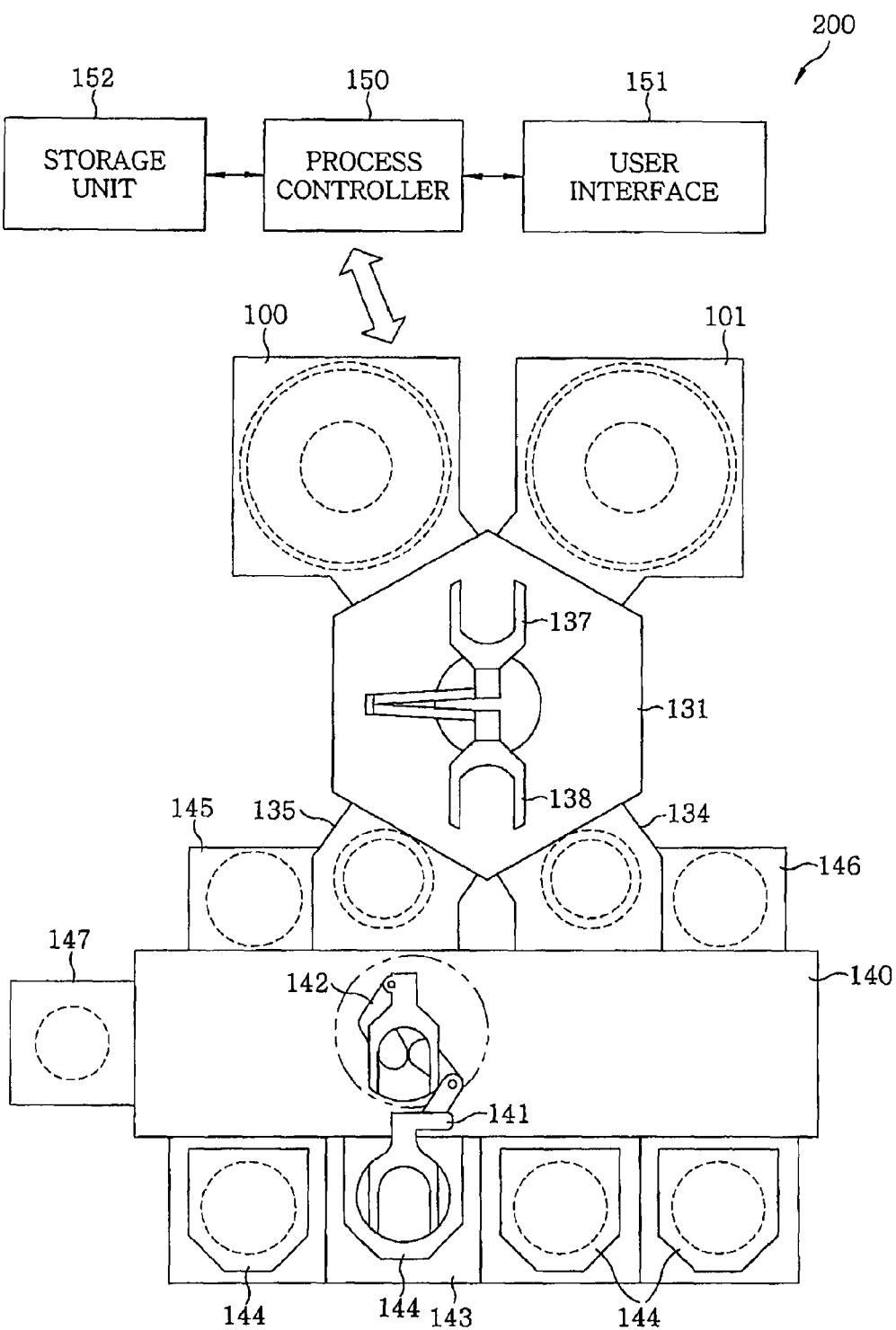
FIG. 4 schematically shows a plan view of a substrate processing system that can be properly used in the method for forming a gate insulating film in accordance with the embodiment of the present invention.

Next, a substrate processing system properly used in the gate insulating film forming method for the present invention will be described. FIG. 4 is a plan view schematically showing a configuration of the substrate processing system 200. A transfer chamber 131 is disposed approximately at the center of the substrate processing system 200 to be used to transfer the wafer W. The plasma processing apparatus 100 for performing a plasma nitriding process on the wafer W, the heat treating unit 101 for performing a thermal process including a thermal oxidation process on the wafer W, gate valves (not shown) allowing connection/isolation of respective process chambers, and two-stage load-lock units 134 and 135 allowing transfer of the wafer W between the transfer chamber 131 and an atmospheric transfer chamber 140 are disposed to surround the transfer chamber 131.

A preliminary cooling unit 145 and a cooling unit 146 are respectively disposed at the sides of the load-lock units 135 and 134 to perform various preliminary cooling or cooling operations. Further, when the load-lock units 134 and 135 are used as cooling units, the preliminary cooling unit 145 and the cooling unit 146 may be omitted.

Transfer arms 137 and 138 are disposed in the transfer chamber 131 to be used to transfer the wafer W between the respective units.

The atmospheric transfer chamber 140 connected to the load-lock units 134 and 135 is prepared, and is provided with transfer units 141 and 142. The atmospheric transfer chamber 140 is maintained under a clean environment through downwardly flowing clean air. A cassette unit 143 is connected to the atmospheric transfer chamber 140, and the wafer W is loaded into or unloaded from four cassettes 144 set in the cassette unit 143 by using the transfer units 141 and 142. Further, an alignment chamber 147 is provided at a place close to the atmospheric transfer chamber 140, and alignment of the wafer W is carried out in the alignment chamber 147.

Further, each component of the substrate processing system 200 is controlled by using a process controller 150 including a CPU. A user interface 151, including a keyboard for inputting commands and a display for displaying an operation status of the substrate processing system 200, is connected to the process controller 150 to allow a process manager to manage the substrate processing system 200.

Further, the process controller 150 is connected to a storage unit 152 which stores recipes including control programs (software) for implementing various processes in the plasma processing apparatus 100 under control of the process controller 150, process condition data and the like.

If necessary, as a certain recipe is retrieved from the storage unit 152 in accordance with an instruction inputted through the user interface 151 and transmitted to the process controller 150, a desired process is performed in the plasma processing apparatus 100 under control of the process controller 150. Further, the recipes including control programs, process condition data and the like can be stored in and retrieved from a computer-readable storage medium such as a CD-ROM, a hard disk, a flexible disk and a flash memory, or retrieved through an on-line connected via, for example, a dedicated line to another apparatus available all the time.

FIG. 5 schematically illustrates a cross sectional view showing one example of the plasma processing apparatus 100 serving as a plasma nitriding unit in the substrate processing system 200. The plasma processing apparatus 100 is configured as an RLSA microwave plasma processing apparatus capable of generating a microwave-excited plasma of a high density and a low electron temperature by introducing a microwave into a process chamber with a planar antenna, particularly, radial line slot antenna (RLSA), having a plurality slots. In the plasma processing apparatus 100, a process can be performed by using a plasma having a plasma density ranging from $1 \times 10^{10}$ to $5 \times 10^{12}/cm^3$ and a low electron temperature ranging from 0.5 to 2 eV. Thus, the plasma processing apparatus 100 may be properly used to form a gate insulating film in the process of manufacturing various semiconductor devices, such as a metal-oxide-silicon (MOS) transistor.

Further, if the plate 60, which will be described later, is used, a plasma containing radicals having an ultra-low electron temperature ranging from 1 to 2 [eV] is generated in a first plasma region $S_1$, and a plasma containing radicals having an ultra-low electron temperature between 0.5 and 1 [eV] is generated in a second plasma region $S_2$, thereby achieving plasma processing inflicting low damage.

The plasma processing apparatus 100 includes an approximately cylindrical chamber 1, which is hermetically sealed and grounded. A circular opening 10 is formed at an approximately central portion of a bottom wall 1a of the chamber 1. A gas exhaust chamber 11, which is connected to the opening 10 and is protruded downwardly, is installed on the bottom wall 1a.

A susceptor 2 made of ceramic such as AlN is installed in the chamber 1 to horizontally support a substrate to be processed, i.e., a wafer W. The susceptor 2 is supported by a cylindrical support member 3 which is made of ceramic such as AlN and is extended upwardly from a central bottom portion of the gas exhaust chamber 11. A guide ring 4 for guiding the wafer W is installed at an outer peripheral portion of the susceptor 2. Further, a resistance heater 5 is embedded in the susceptor 2. The resistance heater 5 is supplied with power from a heater power supply 6 to heat the susceptor 2, thereby heating the wafer W. In this case, a process temperature can be controlled within a range, for example, from a room temperature to 800° C. Further, a cylindrical liner 7 made of quartz is installed at the inner periphery of the chamber 1. A baffle plate 8, which is made of quartz and has a plurality of gas exhaust holes 8a, is installed in a ring shape at the outside of the susceptor 2 to uniformly evacuate the chamber 1. The baffle plate 8 is supported by several pillars 9.

Wafer supporting pins (not shown) are provided in the susceptor 2 to be protruded from the surface of the susceptor 2 and retracted into the susceptor 2, thereby supporting and moving the wafer W up and down.

The plate 60 is disposed above the mounting table 2 to attenuate ion energy in the plasma. By using the plate 60, when a silicon nitride film having an ultra-thin film thickness less than 1 nm is formed, controllability of the film thickness is improved. The plate 60 is made of a dielectric material of ceramic, such as quartz, sapphire, SiN, SiC, $Al_2O_3$, or AlN, polysilicon, single crystalline silicon, or amorphous silicon. Among these materials, a material having a high level of purity, such as quartz, SiN, polysilicon, single crystalline silicon, or amorphous silicon, is desirable in order to prevent metal contamination. Further, the plate 60 is supported by engagement with a support part 70, the peripheral portion of which protrudes from the liner 7 in the chamber 1 toward the inside of the chamber 1 throughout the entire circumference of the chamber 1. Further, the plate 60 may be supported by other methods.

A plate 60 is preferably installed at a position close to the wafer W, and a distance (height $H_2$) between the plate 60 and the wafer W is preferably within a range from 3 to 50 mm, and more preferably from 25 to 35 mm. In this case, a distance (height $H_1$) between the upper surface of the plate 60 and the lower surface of a transmission plate 28 (to be described later) ranges from preferably 30 to 150 mm, and more preferably from 50 to 100 mm. By disposing the plate 60 at the above position, it is possible to achieve uniform nitriding of silicon while suppressing plasma damage.

The first plasma region $S_1$ is formed in a space above the plate 60, and the second plasma region $S_2$ is formed in a space below the plate 60. Preferably, the volume of the first plasma region $S_1$ and the volume of the second plasma region $S_2$ are equal, or the volume of the second plasma region $S_2$ is smaller than the volume of the first plasma region $S_1$. A ratio ($H_1/H_2$) of the height $H_1$ of the first plasma region $S_1$ to the height $H_2$ of the second plasma region $S_2$ ranges preferably from 0.6 to 50, and more preferably from 1.4 to 4.

Figure 6:
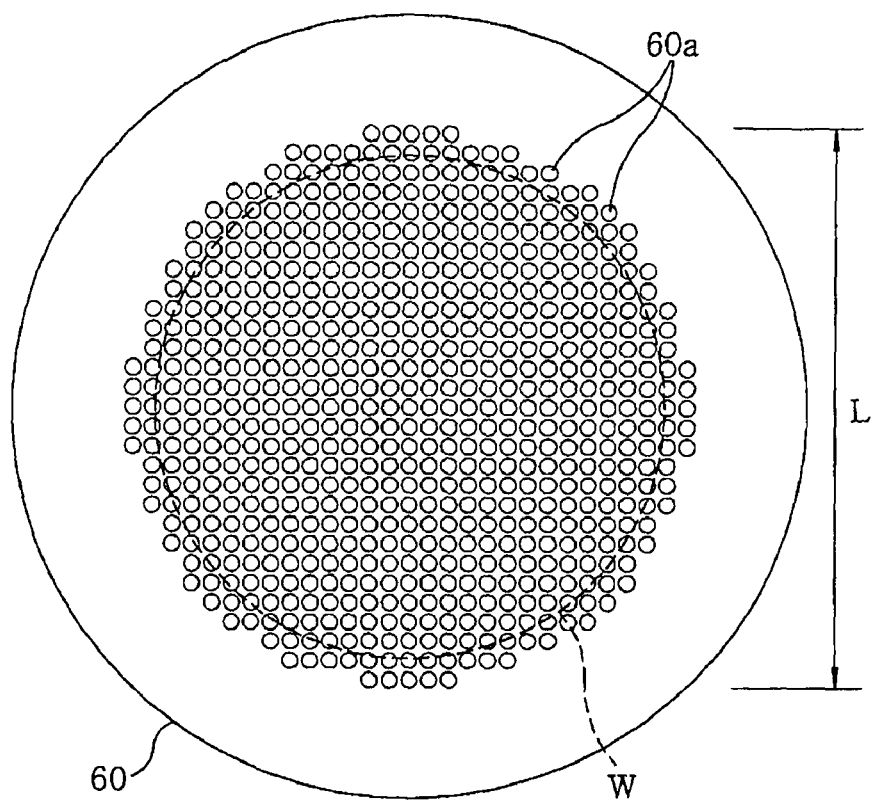
FIG. 6 is a plan view of a plate provided in the plasma nitriding unit shown in FIG. 5.
Figure 7:
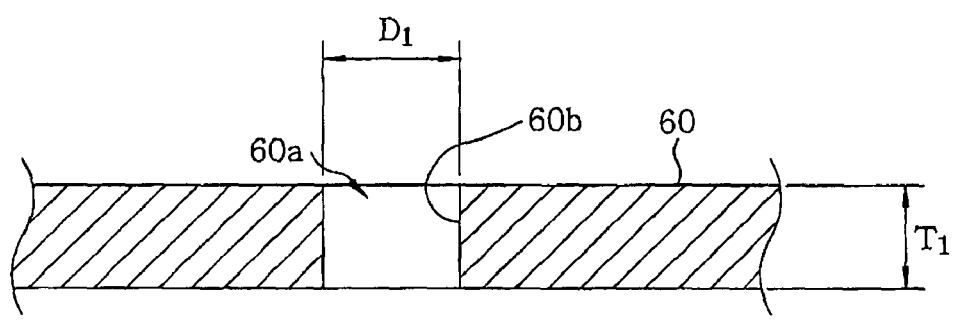
FIG. 7 is a cross sectional view illustrating an essential part of the plate provided in the plasma nitriding unit shown in FIG. 5.

Plural through holes 60a are formed through the plate 60. FIGS. 6 and 7 are detailed views of the plate 60. FIG. 6 illustrates a top view of the plate 60, and FIG. 7 illustrates a cross sectional view of an essential part of the plate 60.

The through holes 60a of the plate 60 are approximately uniformly arranged such that an arrangement region of the through holes 60a is slightly larger than a mounting region of the wafer W expressed by a dashed line in FIG. 6. Specifically, for example, in FIG. 6, the through holes 60a are arranged such that a length L corresponding the diameter of a circle passing through the outer periphery of the arrangement region of the through holes 60a is expanded outward from the outer periphery of the wafer W having a diameter of 300 mm by the pitch of the through holes 60a or more, e.g., ranging from 5 to 30 mm. Further, the through holes 60a may be arranged throughout the entire surface of the plate 60. The nitriding is uniformly carried out by arranging the through holes 60a over a wider region than the diameter of the wafer W.

The diameter $D_1$ of the through holes 60a may be set to a certain value, preferably in a range from 2 to 15 mm, and more preferably from 2.5 to 10 mm. FIG. 6 illustrates the through holes 60a having a diameter of 10 mm. The size of the through holes 60a may be varied by the position of the through holes 60a in the plate 60, and the through holes 60 may be arranged randomly, e.g., concentrically, radially, or spirally. Further, the thickness $T_1$ of the plate 60 is preferably in a range from 2 to 20 mm, and more preferably from 2 to 5 mm. By setting the diameter of the through holes 60a to the above values, sheath voltage ($V_{dc}$) on the surface of the substrate is lowered, and ion damage to the wafer is reduced, thereby achieving uniform nitriding.

The plate 60 functions as an ion energy reducing unit to reduce a total level of ion energy of plasma.

That is, the plate 60 made of a dielectric material mainly allows radicals in the plasma to pass therethrough, thereby blocking a large amount of ions. For this, it is preferable to comprehensively consider the opening area of the through holes 60a of the plate 60, the diameter $D_1$ of the through holes 60a, the shape or arrangement of the through holes 60a, the thickness $T_1$ of the plate 60 (i.e., the height of a wall 60b), the installation position of the plate 60 (i.e., the distance from the wafer W), as will be described later. For example, if the diameter of the through holes 60a is set to range from 2.5 to 10 mm, the ratio of the total opening area of the through holes 60a to the area of the wafer W in the region of the plate 60 corresponding to the wafer W (i.e., the range overlapping the wafer W) becomes preferably to fall within a range between 10 and 50%. By controlling the ratio of the total opening area of the through holes 60a to the area of the wafer W, ion energy is suppressed, and the nitriding is achieved at a low sheath voltage ($V_{dc}$) state.

Although the plasma processing apparatus 100 shown in FIG. 5 includes a single plate 60, two or more plates may be stacked, if necessary. The opening area of the through holes 60a or the ratio of the total opening area of the through holes 60a to the area of the wafer W may be properly adjusted depending on an object subjected to the plasma nitriding or the processing conditions.

A gas inlet member 15 having a ring shape is provided at a sidewall of the chamber 1. A gas supply system 16 is connected to the gas inlet member 15. The gas inlet member 15 may have a showerhead shape. For example, the gas supply system 16 includes an Ar gas supply source 17 and an $N_2$ gas supply source 18. Ar, and $N_2$ gases reaching the gas inlet member 15 via respective gas lines 20 are introduced into the chamber 1 through the gas inlet member 15. Each of the gas lines 20 is provided with a mass flow controller 21 and valves 22 located at the upstream and downstream sides of the mass flow controller 21. Further, $N_2$ gas may be replaced with other gases containing nitrogen, e.g., $NH_3$ gas, a gaseous mixture containing $N_2$ and $H_2$, hydrazine or the like, preferably, gases containing nitrogen without hydrogen, such as $N_2$ gas. Further, Ar gas may be replaced with other rare gases, such as Kr gas, Xe gas, He gas or the like.

A gas exhaust pipe 23 is connected to the side surface of the gas exhaust chamber 11, and a gas exhaust unit 24 including a high speed vacuum pump is connected to the gas exhaust pipe 23. As the gas exhaust unit 24 is operated, the gas in the chamber 1 is uniformly withdrawn to a space 11a of the gas exhaust chamber 11 and is discharged through the gas exhaust pipe 23. Accordingly, the inner pressure of the chamber 1 may be rapidly lowered down to a predetermined vacuum level of, e.g., 0.133 Pa.

At the sidewall of the chamber 1, there are provided a loading/unloading port 25 through which the wafer W is delivered between the chamber 1 and a transfer chamber (not shown) adjacent to the plasma processing apparatus 100, and a gate valve 26 for opening and closing the loading/unloading port 25.

An opening is formed at an upper portion of the chamber 1, and a support part 27 having a ring shape is installed along the circumference of the opening. A transmitting plate 28, which is made of a dielectric, e.g., ceramic such as quartz, $Al_2O_3$ or AlN, and transmits a microwave, is airtightly installed at the support part 27 through a seal member 29. Therefore, the inside of the chamber 1 can be maintained in a hermetically sealed state.

Figure 8:
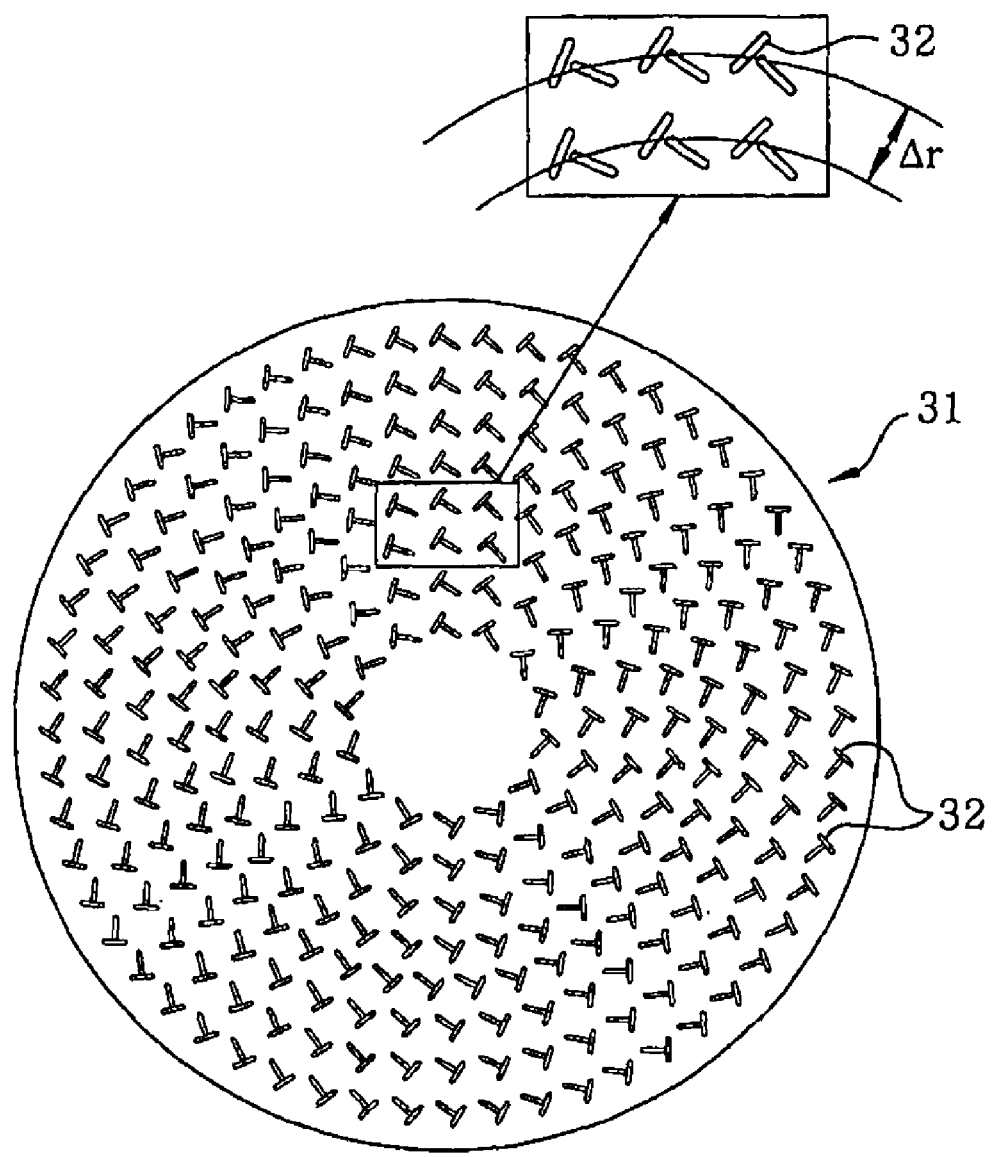
FIG. 8 is a plan view illustrating one example of a planar antenna member used in the substrate processing system shown in FIG. 4.

A planar antenna plate 31 having a circular plate shape is installed above the transmitting plate 28 to face the susceptor 2. The planar antenna plate 31 is suspended on the upper end of the sidewall of the chamber 1. The planar antenna plate 31 is made of an aluminum plate or a copper plate, the surface of which is coated with silver or gold. A plurality of slot-shaped microwave radiation holes 32 to radiate the microwave are formed in a specific pattern through the planar antenna plate 31. As shown in FIG. 8, the microwave radiation holes 32 have pairs of long slots, wherein each pair of the microwave radiation holes 32 are generally arranged in a "T" shape. The pairs of the holes 32 are arranged in plural concentric circles. The length and arrangement interval of the holes 32 depend on the wavelength ($\lambda g$) of the microwave. For example, the holes 32 may be arranged at intervals of $\lambda g/4$, $\lambda g/2$ or $\lambda g$. In FIG. 8, an interval between the adjacent holes 32 on different concentric circles is represented by $\Delta r$. Also, the holes 32 may have a circular shape, a circular arc shape or the like. No particular limitation is imposed on the arrangement of the holes 32. For example, the holes 32 may be arranged in a spiral or radial pattern in addition to the concentric circular pattern.

A wave retardation member 33, which is made of a dielectric material having a larger dielectric constant than that of a vacuum, is installed on the upper surface of the planar antenna plate 31. Since the microwave has a longer wavelength in a vacuum, the wave retardation member 33 functions to shorten the wavelength of the microwave to control the plasma. Further, the planar antenna member 31 and the transmission plate 28 or the wave retardation member 33 and the planar antenna member 31 may be in contact with each other or be separated from each other.

A shield cover 34, which is made of metal such as aluminum, stainless steel or the like, is installed on the upper surface of the chamber 1 to cover the planar antenna plate 31 and the wave retardation member 33. The shield cover 34 forms a flat waveguide in a space with the planar antenna member 31. The upper surface of the chamber 1 and the shield cover 34 are sealed with a seal member 35. Cooling water paths 34a are formed in the shield cover 34, and cooling water flows through the cooling water paths 34a to cool the shield cover 34, the wave retardation member 33, the planar antenna plate 31 and the transmitting plate 28. Further, the shield cover 34 is grounded.

An opening 36 is formed at the center of an upper wall of the shield cover 34, and a waveguide 37 is connected to the opening 36. A microwave generator 39 is connected to an end of the waveguide 37 via a matching circuit 38. Accordingly, a microwave generated in the microwave generator 39 and having a frequency of, e.g., 2.45 GHz propagates to the planar antenna plate 31 via the waveguide 37. Further, the microwave may have a frequency of 8.35 GHz, 1.98 GHz, or the like.

The waveguide 37 includes a coaxial waveguide 37a having a circular cross sectional shape, which is extended upwardly from the opening 36 of the shield cover 34, and a rectangular waveguide 37b, which is connected to the upper end of the coaxial waveguide 37a via a mode converter 40 and is extended in the horizontal direction. The mode converter provided between the coaxial waveguide 37a and the rectangular waveguide 37b functions to convert a microwave propagating in a TE mode through the rectangular waveguide 37b into a TEM mode microwave. An internal conductor 41 is provided at the center of the coaxial waveguide 37a, and a lower end of the internal conductor 41 is fixed to the center of the planar antenna plate 31. Accordingly, the microwave propagates radially and efficiently to the planar antenna plate 31 via the internal conductor 41 of the coaxial waveguide 37a.

The above plasma processing apparatus 100 of an RLSA type performs a process, such as formation of a silicon nitride film by carrying out direct nitriding of a silicon layer on a wafer W, in a following sequence.

First, the gate valve 26 is opened, and a wafer W with a silicon layer is loaded through the loading/unloading port 25 into the chamber 1, and is mounted on the mounting table 2. Then, Ar gas and $N_2$ gas from the Ar gas supply source 17 and the $N_2$ gas supply source 18 of the gas supply system 16 are supplied to the inside of the chamber 1 at designated flow rates via the gas inlet member 15. Further, the inside of the chamber 1 is adjusted to be maintained under a predetermined pressure, and the wafer W is heated to a predetermined temperature.

Thereafter, the microwave from the microwave generating device 39 is transmitted to the waveguide unit 37 through the matching circuit 38, and the microwave in the waveguide unit 37 sequentially passes through the rectangular waveguide 37b, the mode converter 40, and the coaxial waveguide 37a, and is supplied to the planar antenna member 31 through the internal conductor 41. Then, the microwave is radiated through the holes (slots) 32 of the planar antenna member 31 to the space above the wafer W in the chamber 1 via the transmission plate 28. The microwave propagates in the TE mode within the rectangular waveguide 37b, and the TE mode microwave is converted into a TEM mode microwave by the mode converter 40. The TEM mode microwave propagates within the coaxial waveguide 37a toward the planar antenna member 31. Preferably, the power of the microwave generating device 39 is set to be within a range between 0.5 and 5 kW.

An electromagnetic field is formed in the chamber 1 by the microwave radiated from the planar antenna member 31 into the chamber 1 via the transmission plate 28 to generate a plasma of Ar gas and $N_2$ gas. This microwave plasma is a plasma having a high density ranging approximately from $1 \times 10^{10}$ to $5 \times 10^{12}/cm^3$, which is obtained by radiating the microwave through the plural holes 32 of the planar antenna member 31, and a low electron temperature of about 1.5 [eV] or less around the wafer W.

The microwave plasma thus obtained causes little plasma damage to a base film due to ions. However, the plate 60 made of a dielectric is provided in the chamber 1 to divide the inside of the chamber 1 into the first plasma region $S_1$ to generate a plasma and the second plasma region $S_2$ to process the wafer W by the plasma passed through the plate 60, and thus ion energy in the second plasma region $S_2$ is drastically reduced and sheath voltage ($V_{dc}$) around the substrate is lowered. Further, the electron temperature of the plasma may be reduced to 1 [eV] or less, preferably 0.7 [eV] or less, and thus plasma damage may be more reduced.

Further, nitrogen (N) may be introduced directly into silicon by the action of active species in the plasma, mainly nitrogen radicals N*, and thus a uniform SiN film may be formed.

Next, FIG. 9 schematically shows a cross sectional view of the heat treating unit 101 used in the substrate processing system 200. The heat treating unit 101 includes one rapid thermal processing (RTP) apparatus to carry out rapid thermal annealing (RTA) having high controllability, and may be used in thermal oxidation or annealing of a thin film formed on a wafer in a high-temperature region ranging from 800 to 1,200° C.

Further, a batch type heat treating unit may be used as the heat treating unit 101 such that plural substrates are simultaneously processed.

In FIG. 9, reference numeral 71 represents a cylindrical process chamber, and a lower heating unit 72 is detachably mounted on the lower surface of the process chamber 71. Further, an upper heating unit 74 arranged to face the lower heating unit 72 is detachably mounted on the upper surface of the process chamber 71. The lower heating unit 72 includes a water cooling jacket 73, in which water cooling channels, not shown, are formed, and a plurality of tungsten lamps 76, serving as heating members, arranged on the upper surface of the water cooling jacket 73. As in the lower heating unit 72, the upper heating unit 74 includes a water cooling jacket 75, in which water cooling channels, not shown, are formed, and a plurality of tungsten lamps 76, serving as heating members, arranged on the lower surface of the water cooling jacket 75. Further, the heating members are not limited to the tungsten lamps 76, but halogen lamps, Xe lamps, mercury lamps, or flash lamps may be used. The respective tungsten lamps 76 disposed opposite to each other in the process chamber 71 are connected to a power supply unit, which is not shown in the drawing, and a controller (the process controller 150) to control a power supply amount from the power supply unit, and the heat discharge rate of the tungsten lamps 76 is controlled thereby.

A support part 77 to support the wafer W is provided between the lower heating unit 72 and the upper heating unit 74. The support part 77 includes wafer support pins 77a to support the wafer W under the condition that the wafer W is held in the processing space within the process chamber 71, and a liner installation part 77b to support a hot liner 78 to measure the temperature of the wafer W during the process. Further, the support part 77 is connected to a rotating mechanism (not shown), and thus is rotated around a vertical axis. Thereby, the wafer W is rotated at a designated speed during the process, and thermal processing is uniformly achieved.

A pyrometer 81 is disposed below the chamber 71. The temperature of the wafer W is indirectly obtained by measuring the temperature of a heat ray from the hot liner 78 with the pyrometer 81 via a pot 81a and an optical fiber 81b during the thermal processing. Further, the temperature of the wafer W may be directly measured.

A quartz member 79 is interposed between the hot liner 78 and the tungsten lamps 76 of the lower heating unit 72, and the pot 81a is provided on the quartz member 79, as shown in FIG. 9. Further, a plurality of pots may be disposed.

Further, a quartz member 80a is interposed between the upper surface of the wafer W and the tungsten lamps 76 of the upper heating unit 74. A quartz member 80b is provided on the inner peripheral surface of the chamber 71 to surround the wafer W.

Lifter pins (not shown) to support and raise/lower the wafer W are provided such that the lifter pins pass through the hot liner 78, and are used to load and unload the wafer W.

Seal members (not shown) are respectively interposed between the lower heating unit 72 and the process chamber 71 and between the upper heating unit 74 and the process chamber 71, and thus the process chamber 71 is hermetically sealed.

A gas supply source 83 connected to a gas introduction pipe 82 is provided at the side of the process chamber 71, and serves to introduce gases, for example, $N_2O$ gas, $O_2$ gas, and Ar gas, into the processing space of the process chamber 71. Further, a gas exhaust pipe 84 is provided at the lower portion of the process chamber 71, and decompresses the inside of the process chamber 71 through an exhaust device, which is not shown.

In the above-described heat treating unit 101, the wafer W is set on the wafer support part 77 in the process chamber 71, and then the space in the process chamber 71 is hermetically sealed. Thereafter, when a designated power is supplied from the power supply unit, not shown, to the respective tungsten lamps 76 of the lower heating unit 72 and the upper heating unit 74 to turn on the tungsten lamps under the control of the process controller 150, the respective tungsten lamps 76 generate heat, the generated heat reaches the wafer W through the quartz member 79 and the quartz member 80a, and the upper and lower parts of wafer W are rapidly heated under the conditions (a heating rate, a heating temperature, etc.) based on a recipe. The inside of the chamber 71 is maintained under a decompressed state by carrying out the exhaust of the chamber 71 through the gas exhaust pipe 84 by operating the exhaust device, not shown, while heating the wafer W.

During the thermal processing, the wafer W is rotated by the rotation of the support part 77 around the vertical axis at a designated speed with the rotating mechanism, not shown. Accordingly, uniformity in the amount of heat supplied to the wafer W is obtained.

Further, the temperature of the wafer W is indirectly obtained by measuring the temperature of the hot liner 78 with the pyrometer 81 during the thermal processing. The temperature data obtained by the pyrometer 81 is fed back to the process controller 150, and if there is a difference between the obtained temperature and the predetermined temperature in the recipe, the supply of the power to the tungsten lamps 76 is adjusted.

After the thermal processing has been completed, the tungsten lamps 76 of the lower heating unit 72 and the upper heating unit 74 are turned off. The gases in the process chamber 71 are exhausted through the gas exhaust pipe 84 to cool the wafer, while supplying purge gas, such as nitrogen, from a purge pot, not shown, to the inside of the process chamber 71. Thereafter, the cooled wafer W is unloaded from the process chamber 71.

The above-described substrate processing system 200 carries out a series of the processes of steps S1 and S2, preferably steps S1 to S3, and more preferably steps S1 to S4, as shown in FIG. 1, and thus forms an insulating film of good quality (the silicon oxynitride film 306) on the surface of silicon, such as single crystalline silicon, polycrystalline silicon, or amorphous silicon.

That is, the transfer unit 141 or 142 of the atmospheric transfer chamber 140 receives a wafer W from any one of the cassettes 144 on the cassette unit 143, and loads the wafer W into any one of the load-lock units 134 and 135. Thereafter, the inside of the load-lock unit 134 or 135 is decompressed, the wafer is unloaded from the load-lock unit 134 or 135 by using the transfer arm 137 or 138 of the transfer chamber 131 and is loaded into the plasma processing apparatus 100, and the first nitriding process of step S1 is carried out under the above processing conditions. After the first nitriding process is completed, the wafer W is unloaded from the plasma processing apparatus 100 and is loaded into the heat treating unit 101 by the transfer arm 137 or 138. Then, the oxidation process of step S2 is carried out in the heat treating unit 101 under the above processing conditions.

After the oxidation process is completed, the processes of steps S3 and S4 may be continuously carried out. In this case, the wafer W is unloaded from the heat treating unit 101 and is loaded again into the plasma processing apparatus 100 by using the transfer arm 137 or 138. Then, the second nitriding process of step S3 is carried out in the plasma processing apparatus 100 under the above processing conditions. After the second nitriding process is completed, the wafer W is unloaded from the plasma processing apparatus 100 and is loaded again into the heat treating unit 101 by using the transfer arm 137 or 138, and the annealing process of step S4 is carried out under the above processing conditions.

After all the processes are completed, the wafer W is unloaded from the heat treating unit 101 and is loaded into any one of the load-lock units 134 and 135 by the transfer arm 137 or 138. Thereafter, the inside of the load-lock unit 134 or 135 is restored back to the atmospheric pressure, and the wafer W is unloaded from the load-lock unit 134 or 135 and is returned to any one of the cassettes 144 on the cassette unit 143 by the transfer unit 141 or 142 of the atmospheric chamber 140. By the above procedure, a series of the processes on one wafer W is completed. The wafer W is processed in a vacuum without exposure to the atmosphere by the above system, and thus an insulating film may be formed on the wafer W without contaminating the wafer with organic matters.

Figure 10A:
FIG. 10A illustrates a cross sectional view showing formation of a device isolation layer in a transistor manufacturing process, to which the insulating film forming method of the present invention is applied.
Figure 10B:
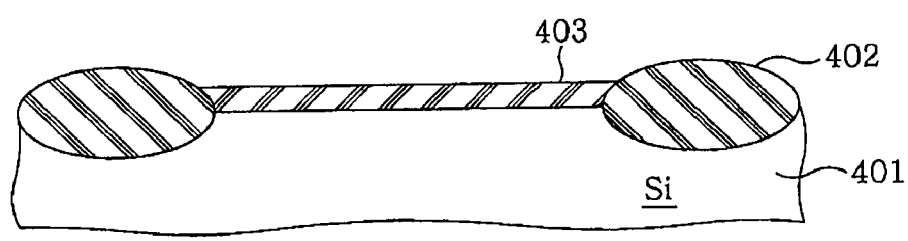
FIG. 10B illustrates a cross sectional view showing formation of an insulating film in the transistor manufacturing process, to which the insulating film forming method of the present invention is applied.
Figure 10C:
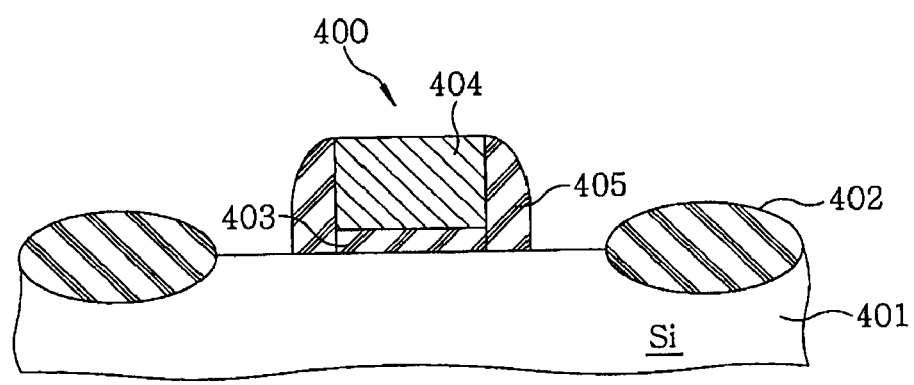
FIG. 10C illustrates a cross sectional view showing formation of a transistor in the transistor manufacturing process, to which the insulating film forming method of the present invention is applied.

The insulating film (the silicon oxynitride film 306) obtained by the above procedure may be used as a gate insulating film in manufacture of various semiconductor devices, for example, a transistor. Particularly, the above insulating film is valuably used as a thin film in a new generation of devices, for example, a gate insulating film having a film thickness of 1 nm or less, preferably between 0.5 and 1 nm. FIGS. 10A to 10C are views illustrating an application example of the insulating film forming method of the present invention to a manufacturing process of a transistor.

As shown in FIG. 10A, a well (not shown) is formed on a P-type or N-type silicon substrate 401, and a device isolation layer 402 is formed, for example, by a LOCOS method. Further, the device isolation layer 402 may be formed by a shallow trench isolation (STI) process.

Thereafter, as shown in FIG. 10B, a gate insulating film 403 is formed on the surface of the silicon substrate 401 in accordance with the procedure of steps S1 to S4 shown in FIG. 1. The film thickness of the gate insulating film 403 is varied depending on a device to be manufactured, and ranges preferably between 0.5 and 1 nm.

A gate electrode is formed by forming a polysilicon layer 404 on the gate insulating film 403 by chemical vapor deposition (CVD), for example, at a temperature exceeding 400° C. and etching the polysilicon layer 404 by using a mask with a pattern formed by a photolithography technique. Further, the structure of the gate electrode is not limited to a single layer of the polysilicon layer 404, but may be a polycide structure forming silicide, e.g., tungsten, molybdenum, tantalum, titanium, cobalt or nickel, in order to lower resistivity of the gate electrode to obtain a high speed of a device. After the formation of the gate electrode, ion implantation and activation are carried out to form a source/drain (not shown), and a sidewall 405 is formed by an insulating film made of $SiO_2$ or SiN. Thereby, a transistor 400 of a MOS structure is manufactured, as shown in FIG. 10C.

Hereinafter, test results to confirm effects of the present invention will be described.

Silicon nitride films (SiN films) having a film thickness ranging from 0.9 to 1 nm were formed on the surfaces of single crystalline silicon of wafers W by using the plasma processing apparatus 100, as shown in FIG. 5. As conditions of the plasma nitriding, Ar gas and $N_2$ gas were used, the flow rates of Ar and $N_2$ were 1,000 mL/min(sccm) and 200 mL/min(sccm), the temperature of the wafers W was 600° C., the process pressure was 199.9 Pa (1,500 mTorr), the microwave power was 1.5 kW, and the process time was 36 seconds. In the plasma processing apparatus 100, plates 60 including the through holes 60a respectively having diameters of 9.5 mm, 9.7 mm, and 11 mm were used.

Thereafter, silicon oxynitride films (SiON films) were formed by carrying out thermal processing (first annealing) of the wafers W provided with the silicon nitride films (SiN films) in an $N_2O$ atmosphere by using the heat treating unit 101, as shown in FIG. 9. As conditions of the thermal oxidation, the flow rate of $N_2O$ gas was 2 L/min(slm), the temperature of the wafers W was 1,100° C., and the process pressure was 133.3 Pa (1 Torr). Further, for comparison, silicon oxynitride films (SiON films) were formed by carrying out the thermal processing on the same wafers W provided with the silicon nitride films (SiN films) in an $O_2$ atmosphere instead of the $N_2O$ atmosphere. Here, the flow rate of $O_2$ gas was 2

L/min(slm), the temperatures of the wafers W were kept at 1,100° C., and the process pressure was 666.65 Pa (5 Torr).

Figure 11A:
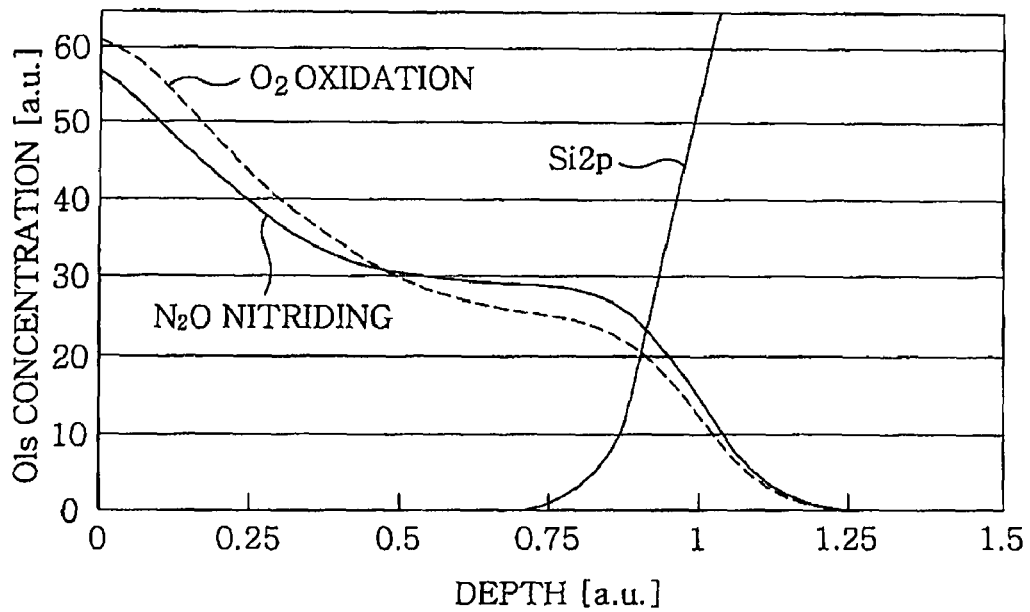
FIG. 11A is a graph illustrating results of XPS analysis of atom distributions of oxygen atoms (O1s) in silicon oxynitride films in the film thickness direction.
Figure 11B:
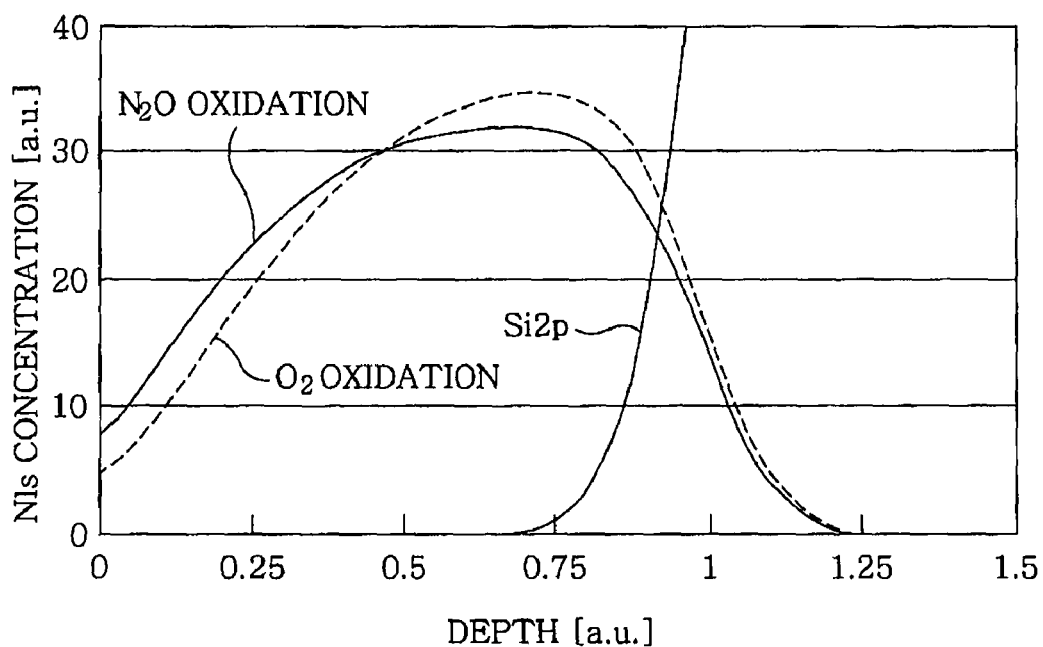
FIG. 11B is a graph illustrating results of XPS analysis of atom distributions of nitrogen atoms (N1s) in the silicon oxynitride films in the film thickness direction.

Atom distributions of oxygen atoms (O1s) and nitrogen atoms (N1s) in the silicon oxynitride films formed in the film thickness direction were measured by using angle resolved X-ray photoelectron spectroscopy (AR-XPS). FIGS. 11A and 11B illustrate the obtained results. In FIG. 11A, the vertical axis represents a normalized concentration of oxygen atoms (O1s), the horizontal axis represents a depth from the normalized surface, and coordinate 0 and coordinate 1 in the horizontal axis respectively represent the surface of the silicon oxynitride film and a SiON—Si interface having an Si concentration of 50%. Further, in FIG. 11B, the vertical axis represents the normalized concentration of nitrogen atoms (N1s), the horizontal axis represents the depth from the normalized surface, and coordinate 0 and coordinate 1 in the horizontal axis respectively represent the surface of the silicon oxynitride film and the SiON—Si interface having an Si concentration of 50%. Further, in FIGS. 11A and 11B, a normalized concentration of silicon atoms (Si2p) is represented also.

From FIGS. 11A and 11B, it is proved that in the silicon oxynitride film obtained by carrying out the thermal oxidation in the $N_2O$ atmosphere, the amount of oxygen atoms (O1s) near the surface of the silicon oxynitride film (SiON film) is smaller and the amount of oxygen atoms (O1s) near the SiON—Si interface is larger, compared with those of the silicon oxynitride film obtained by carrying out the thermal oxidation in the $O_2$ atmosphere. It is believed that this difference in film quality depending on the process gases is caused by a difference in the movement of diffusion when oxygen atoms are diffused into the silicon nitride films (SiN film) between cases when the silicon nitride films are respectively oxidized with $N_2O$ gas and $O_2$ gas.

Further, it has been found that the silicon oxynitride film obtained by carrying out the thermal oxidation by using $N_2O$ gas has an ultra-thin optical film thickness ranging from 2 to 3 nm, and represents an oxygen profile having an oxygen concentration gradient, in which the amount of oxygen atoms is gradually decreased in the film thickness direction from the surface of the silicon oxynitride film to the SiON—Si interface and a designated amount of oxygen atoms is present up to the SiON—Si interface, and a SiON profile having a nitrogen concentration gradient, in which the amount of nitrogen atoms is gradually decreased in the film thickness direction, and oxygen and nitrogen atoms are present at the SiON—Si interface, as shown in FIGS. 11A and 11B. That is, the silicon oxynitride film obtained by carrying out the thermal oxidation by using $N_2O$ gas represents the oxygen profile that a larger amount of oxygen atoms (O1s) are disposed at the SiON—Si interface, compared with the silicon oxynitride film obtained by carrying out the thermal oxidation by using $O_2$ gas. By the introduction of oxygen atoms into the SiON—Si interface, fixed charges are reduced and interface states are decreased. Therefore, in a transistor having a gate insulating film using such a silicon oxynitride film, mobility is improved, characteristics of on current (Ion) and the maximum value ($Gm_{max}$) of transconductance are improved, and suppression of a threshold voltage (Vth) shift is promoted.

Next, effects of the film thickness in the nitriding process of step S1 on electrical characteristics of a device were examined by a method, stated below.

First, the surfaces of single crystalline silicon of wafers W were processed with 1% dilute hydrofluoric acid (DHF). Thereafter, silicon nitride films (SiN films) respectively having film thicknesses of 0.6 nm, 0.7 nm, 0.9 nm, 1.2 nm were formed by carrying out the plasma nitriding by using the plasma processing apparatus 100, as shown in FIG. 5. As conditions of the plasma nitriding, Ar gas and $N_2$ gas were used as process gases, the flow rates of Ar and $N_2$ were 1,000 mL/min(sccm) and 2,000 mL/min(sccm), the temperatures of the wafers W were kept at 600° C., the process pressure ranged from 6.7 to 199.9 Pa (50 mTorr to 1,500 mTorr), and the microwave power was 1.5 kW.

Thereafter, silicon oxynitride films (SiON films) were performed by carrying out the thermal oxidation on the wafers W respectively provided with the silicon nitride films (SiN films) by using the heat treating unit 101, as shown in FIG. 9.

As conditions of the thermal oxidation, the process pressure was kept between 39.9 and 266.6 Pa (300 mTorr to 2 Torr), the flow rates of $N_2O$ and $N_2$ were 300 mL/min(sccm) and 1,700 mL/min(sccm), the process temperature was 1,100° C., and the process time ranged from 10 to 70 seconds.

Figure 12:
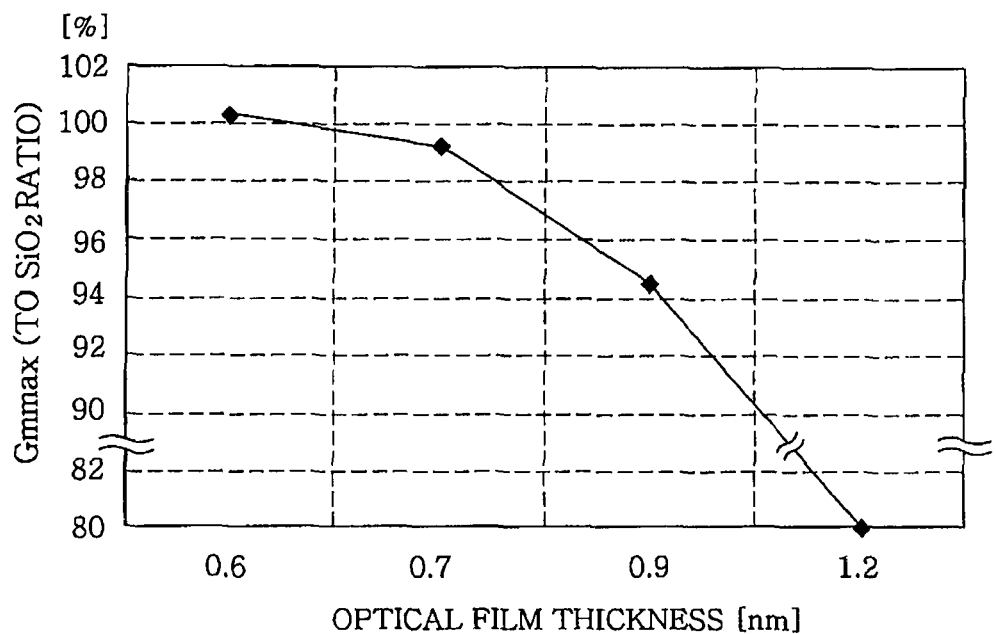
FIG. 12 is a graph illustrating a relationship between the optical film thicknesses of silicon nitride films and the maximum values ($Gm_{max}$) of transconductances.

Thereafter, MOS transistors were manufactured by using the formed silicon oxynitride films as gate insulating films. FIG. 12 illustrates a relationship between the optical film thicknesses of the silicon nitride films and the maximum values ($Gm_{max}$) of transconductances. From FIG. 12, it is proved that the thinner the silicon nitride films are, the higher the maximum values ($Gm_{max}$) of transconductances become. Further, it is confirmed that if the silicon nitride film has an optical film thickness of 0.9 nm or less, the sufficient maximum value ($Gm_{max}$) of transconductance of the device can be obtained.

On the other hand, if the silicon nitride film has an optical film thickness of 1.2 nm, the ratio of the maximum value ($Gm_{max}$) of transconductance of the device to that of $SiO_2$ is merely 80%, and thus the maximum value ($Gm_{max}$) of transconductance is not satisfactory.

Figure 13:
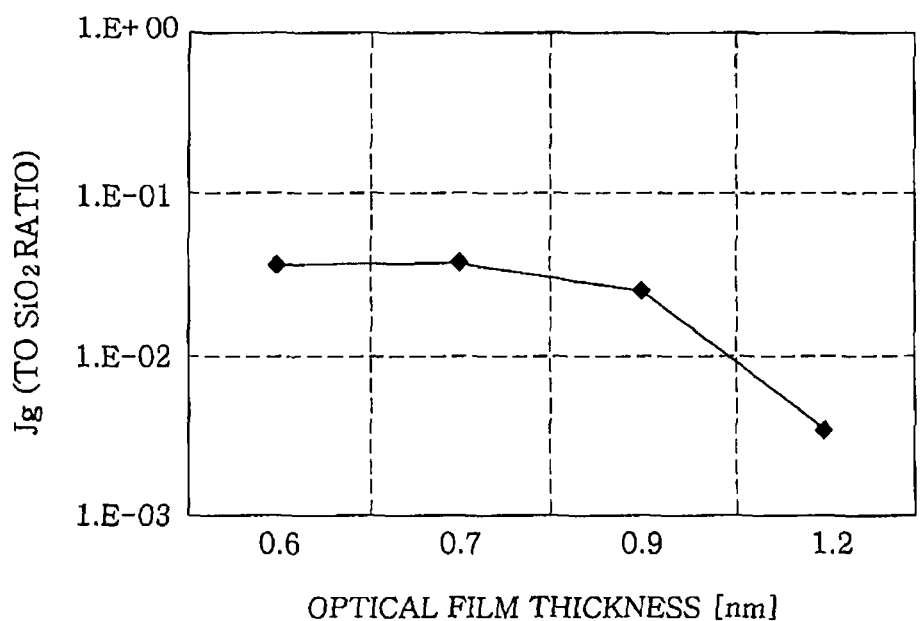
FIG. 13 is a graph illustrating a relationship between the optical film thicknesses of the silicon nitride films and gate leakage currents (Jg).

Further, FIG. 13 illustrates a relationship between the optical film thicknesses of the silicon nitride films and gate leakage currents (Jg). From FIG. 13, it is proved that although the silicon insulating film has a thin optical film thickness ranging from 0.6 to 0.9 nm, the value of leakage current is scarcely increased and is within an allowable range. Therefore, it is proved that the maximum value ($Gm_{max}$) of transconductance of the device is improved without worsening gate leakage current (Jg) by controlling the film thickness in the nitriding process of step S1 to be less than 1 nm.

Next, MOS transistors were manufactured by using silicon oxynitride films formed under various conditions as insulating films, and electrical characteristics of the MOS transistors were evaluated.

In this test, silicon nitride films (SiN films) were firstly formed on the surfaces of single crystalline silicon of wafers W by using the plasma processing apparatus 100, as shown in FIG. 5. The silicon nitride films respectively had film thickness ranging from 0.9 to 1.0 nm.

As conditions of the plasma processing, Ar gas and $N_2$ gas were used as process gases, the flow rates of Ar and $N_2$ were 1,000 mL/min(sccm) and 200 mL/min(sccm), the temperatures of the wafers W were kept at 600° C., the process pressure was 199.9 Pa (1,500 mTorr), the microwave power was 1.5 kW, and the process time was 36 seconds.

Thereafter, silicon oxynitride films (SiON films) were formed by carrying out the thermal oxidation of the wafers W respectively provided with the silicon nitride films (SiN films) by using the heat treating unit 101, as shown in FIG. 9. The thermal oxidation was carried out under conditions, stated below, and a nitrogen concentration in the silicon oxynitride films (SiON films) was varied.

Figure 14:
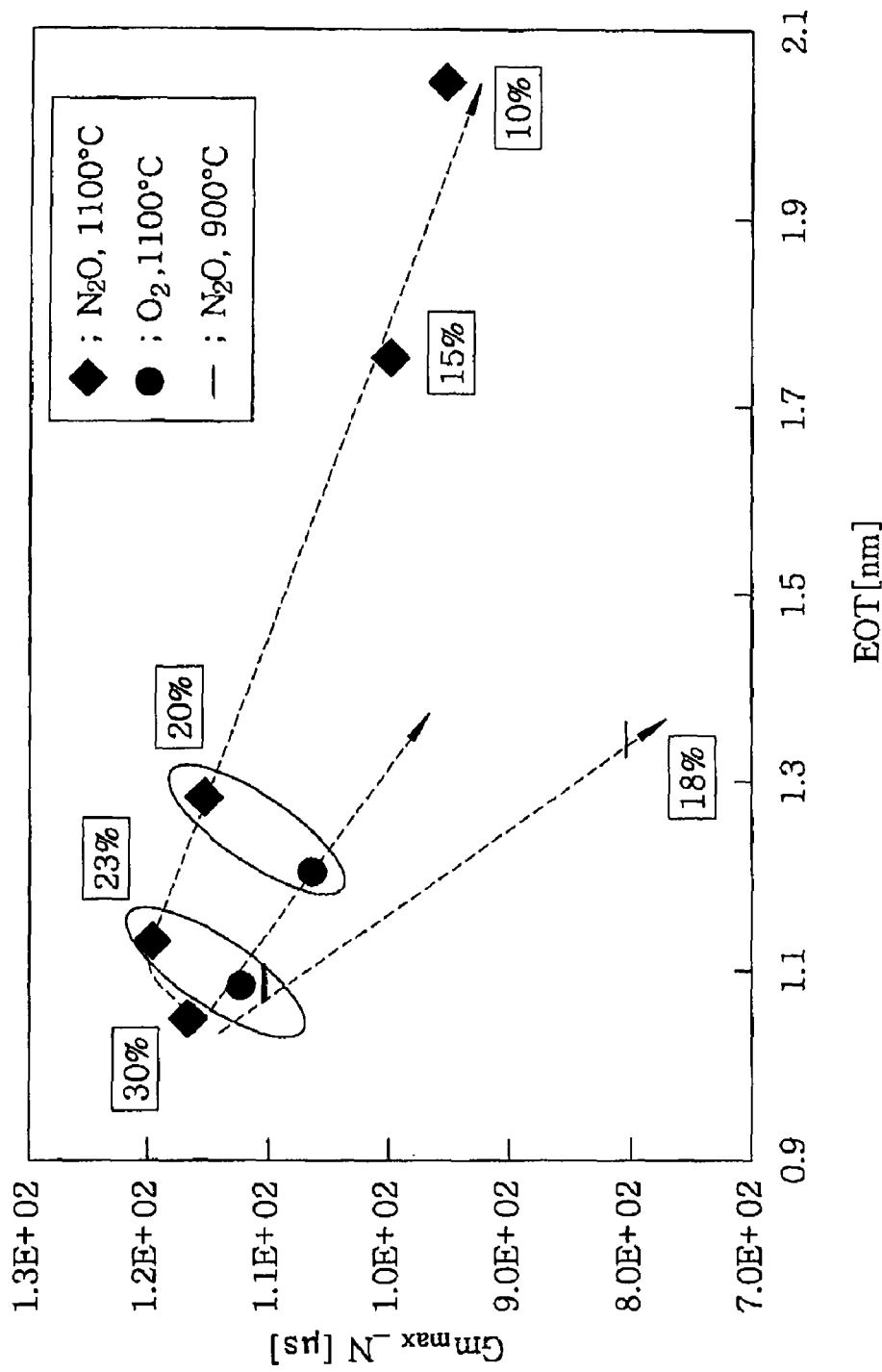
FIG. 14 is a graph illustrating a relationship between the maximum values ($Gm_{max}$) of transconductances and equivalent oxide thicknesses (EOT) of transistors.

<Condition 1: Nitrogen Concentration of 30% in Film>
Process pressure: 266.6 Pa (2 Torr)
Process gas flow rate: $N_2/N_2O=1.7/0.3$ L/min(slm)
Process temperature: 1,100° C.
Process time: 10 seconds
<Condition 2: Nitrogen Concentration of 23% in Film>
Process pressure: 266.6 Pa (2 Torr)
Process gas flow rate: $N_2/N_2O=1.7/0.3$ L/min(slm)
Process temperature: 1,100° C.
Process time: 23 seconds
<Condition 3: Nitrogen Concentration of 20% in Film>
Process pressure: 133.3 Pa (1 Torr)
Process gas flow rate: $N_2O=2$ L/min(slm)
Process temperature: 1,100° C.
Process time: 23 seconds
<Condition 4: Nitrogen Concentration of 15% in Film>
Process pressure: 666.5 Pa (5 Torr)
Process gas flow rate: $N_2O=2$ L/min(slm)
Process temperature: 1,100° C.
Process time: 23 seconds
<Condition 5: Nitrogen Concentration of 10% in Film>
Process pressure: 9,997.5 Pa (75 Torr)
Process gas flow rate: $N_2O=2$ L/min(slm)
Process temperature: 1,100° C.
Process time: 14 seconds
<Condition 6: Nitrogen Concentration of 23% in Film>
Process pressure: 666.5 Pa (5 Torr)
Process gas flow rate: $O_2=2$ L/min(slm)
Process temperature: 1,100° C.
Process time: 15 seconds
<Condition 7: Nitrogen Concentration of 20% in Film>
Process pressure: 9,997.5 Pa (75 Torr)
Process gas flow rate: $O_2=2$ L/min(slm)
Process temperature: 1,100° C.
Process time: 9 seconds
<Condition 8: Nitrogen Concentration of 23% in Film>
Process pressure: 666.5 Pa (2 Torr)
Process gas flow rate: $N_2/N_2O=1.7/0.3$ L/min(slm)
Process temperature: 900° C.
Process time: 25 seconds
<Condition 9: Nitrogen Concentration of 18% in Film>
Process pressure: 9,997.5 Pa (75 Torr)
Process gas flow rate: $N_2O=2$ L/min(slm)
Process temperature: 900° C.
Process time: 19 seconds FIG. 14 illustrates a relationship between $SiO_2$ film equivalent oxide thicknesses (EOT) and the maximum values ($Gm_{max}$) of transconductances of gate insulating films. From FIG. 14, it is proved that there is a large difference in the maximum values ($Gm_{max}$) of transconductances depending on the conditions of the oxidation. It is found that the silicon oxynitride films (SiON films) formed at a process temperature of 1,100° C. by using $N_2O$ gas as the process gas, which are used as insulating films, have significantly higher maximum values ($Gm_{max}$) of transconductances than those of the silicon oxynitride films (SiON films) formed using $O_2$ gas as the process gas at the same equivalent oxide thickness (EOT), and thus have excellent electrical characteristics. That is, by using $N_2O$ gas, the maximum value ($Gm_{max}$) of transconductance is raised without increasing the equivalent oxide thickness (EOT), and the characteristics of the on current (Ion) are improved.

Further, it is found that even if the silicon oxynitride films (SiON films) were formed by using $N_2O$ gas as the process gas, the silicon oxynitride film (SiON film) obtained by carrying out the thermal oxidation at the temperature of 1,100° C. has a higher maximum value ($Gm_{max}$) of transconductance than that of the silicon oxynitride film (SiON film) obtained by carrying out the thermal oxidation at the temperature of 900° C., and thus has excellent electrical characteristics.

From the above results, it is proved that the thermal oxidation process to oxidize a silicon nitride film preferably uses $N_2O$ gas and is carried out at a high temperature of 900° C. or more, preferably within a range from 1,000 to 1,200° C., for a short time ranging from about 5 to 60 seconds. Further, it is confirmed that the partial pressure of $N_2O$ gas is preferably ranging from 3.3 to 133.3 Pa.

Next, effects of the process temperature in the thermal oxidation process of step S2 using $N_2O$ gas on electrical characteristics of a transistor were examined by a method, stated below.

First, the surfaces of single crystalline silicon of wafers W were processed with 1% dilute hydrofluoric acid (DHF). Thereafter, silicon nitride films (SiN films) were formed by carrying out the plasma nitriding by using the plasma processing apparatus 100, as shown in FIG. 5. Here, the silicon nitride films (SiN films) had a film thickness of 0.7 nm.

In the plasma nitriding, Ar gas and $N_2$ gas were used as process gases, the flow rates of Ar and $N_2$ were 1,000 mL/min (sccm) and 200 mL/min(sccm), the temperature of the wafers W was 400° C., the process pressure ranged from 6.7 to 199.9 Pa (from 50 mTorr to 1,500 mTorr), the microwave power was 1.5 kW, and the process time was 500 seconds.

Thereafter, silicon oxynitride films (SiON films) were formed by carrying out the thermal oxidation of the wafers W respectively provided with the silicon nitride films (SiN films) by using the heat treating unit 101, as shown in FIG. 9. In the thermal oxidation, the process pressure ranged from 40 to 1,333 Pa (from 300 mTorr to 10 Torr), the flow rate of $N_2O$ gas used as the process gas was 2 L/min(slm), the process temperatures were set to 1,000° C., 1050° C., and 1,100° C., and the process time ranged from 10 to 70 seconds. NMOS transistors were manufactured respectively by using the obtained silicon oxynitride films as gate insulating films, and the maximum values ($Gm_{max}$) of transconductances of the transistors and the gate leakage current (Jg) of the transistors at a gate voltage of +1.1 V were measured.

Figure 15:
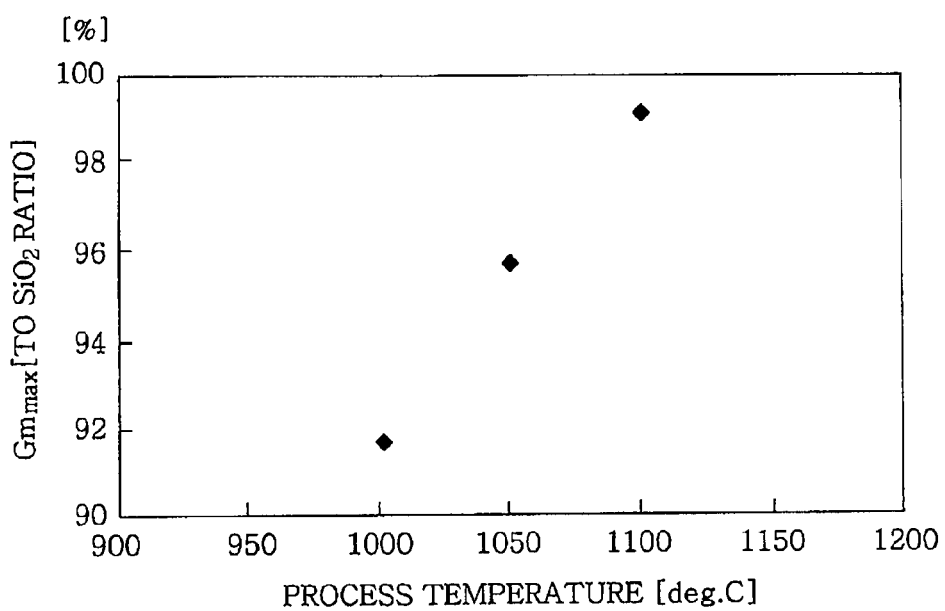
FIG. 15 is a graph illustrating a relationship between temperatures of thermal oxidation and the maximum values ($Gm_{max}$) of transconductances.
Figure 16:
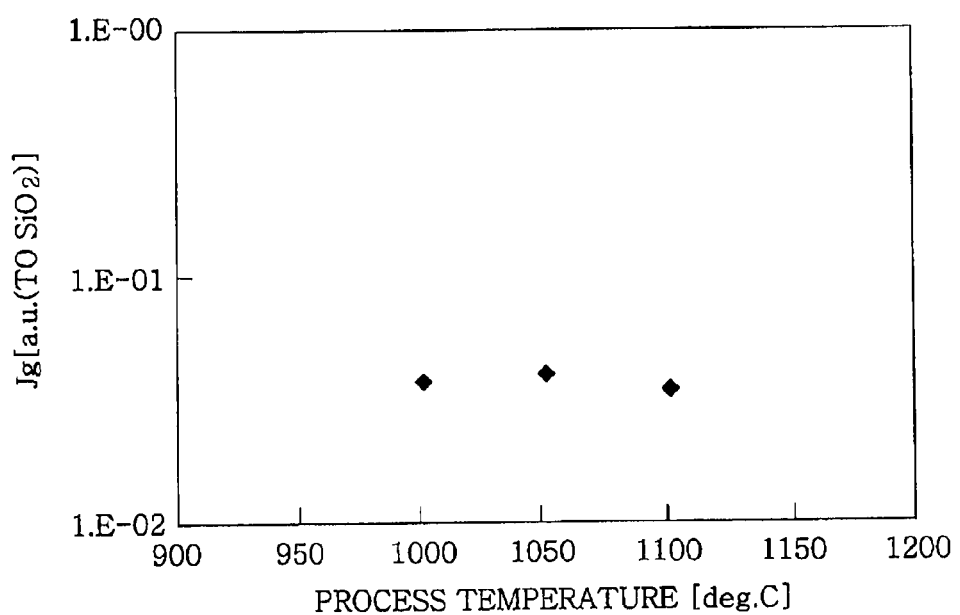
FIG. 16 is a graph illustrating a relationship between temperatures of thermal oxidation and gate leakage currents (Jg).

FIG. 15 illustrates a relationship between the maximum values ($Gm_{max}$) of transconductances and process temperatures, and FIG. 16 illustrates a relationship between gate leakage currents (Jg) and process temperatures. Further, the vertical axis of FIG. 15 represents the percents of the maximum values ($Gm_{max}$) of transconductances assuming that the maximum value ($Gm_{max}$) of transconductance of an NMOS transistor using a silicon oxide film ($SiO_2$ film) as an insulating film is 100%. Further, the vertical axis of FIG. 16 represents gate leakage currents (Jg) normalized with the gate leakage current (Jg) of the NMOS transistor by using a silicon oxide film ($SiO_2$ film) as an insulating film. In FIGS. 15 and 16, the horizontal axes represent temperatures of the thermal oxidation.

From FIG. 15, it is appreciated that the higher the process temperature of the thermal oxidation using $N_2O$ gas is, the more the maximum value ($Gm_{max}$) of transconductance improves. The reason is that the amount of oxygen reaching the interface between the silicon oxynitride film and the silicon layer by the thermal oxidation increases as the process temperature increases, and fixed charges at the interface are reduced. Further, from FIG. 16, it is proved that gate leakage currents (Jg) are approximately uniform regardless of the process temperatures. Therefore, it is confirmed that the thermal oxidation (annealing) of step S2 is preferably carried out at a high temperature of 1,000° C. or more, e.g., between 1,000 and 1,200° C.

Next, effects of the process pressure in the nitriding process of step S3 carried out on the surface of the silicon oxynitride film (SiON film) on profiles of atoms in the film were examined by a method, stated below.

First, the single crystalline silicon surfaces of wafers W were processed with 1% dilute hydrofluoric acid (DHF). Thereafter, silicon nitride films (SiN films) were formed by carrying out the plasma nitriding by using the plasma processing apparatus 100, as shown in FIG. 5. Here, the silicon nitride films (SiN films) had a film thickness of 0.7 nm.

In the plasma nitriding, Ar gas and $N_2$ gas were used as process gases, the flow rates of Ar and $N_2$ were 1,000 mL/min (sccm) and 40 mL/min(sccm), the temperatures of the wafers W were kept at 400° C., the process pressure was 199.9 Pa (1,500 mTorr), and the microwave power was 1.5 kW.

Thereafter, silicon oxynitride films (SiON films) were formed by carrying out the thermal oxidation of the wafers W respectively provided with the silicon nitride films (SiN films) by using the heat treating unit 101, as shown in FIG. 9. In the thermal oxidation, the process pressure was 213 Pa (1,600 mTorr), the flow rates of $N_2O$ and $N_2$ were 1,700 mL/min(sccm) and 300 mL/min(sccm), the process temperature was 1,100° C., and the process time was 30 seconds.

Thereafter, the plasma nitriding was carried out mainly on the surfaces of the silicon oxynitride films by using the plasma processing apparatus 100, as shown in FIG. 5. In the plasma nitriding, Ar gas and $N_2$ gas were used as process gases, the flow rates of Ar and $N_2$ were 1,000 mL/min(sccm) and 40 mL/min(sccm), the temperatures of the wafers W were kept at 400° C., the process pressures were set to 6.7 Pa (50 mTorr), 19.9 Pa (150 mTorr), 45.0 Pa (338 mTorr), and 66.7 Pa (500 mTorr), and the microwave power was 1.5 kW.

Figure 17:
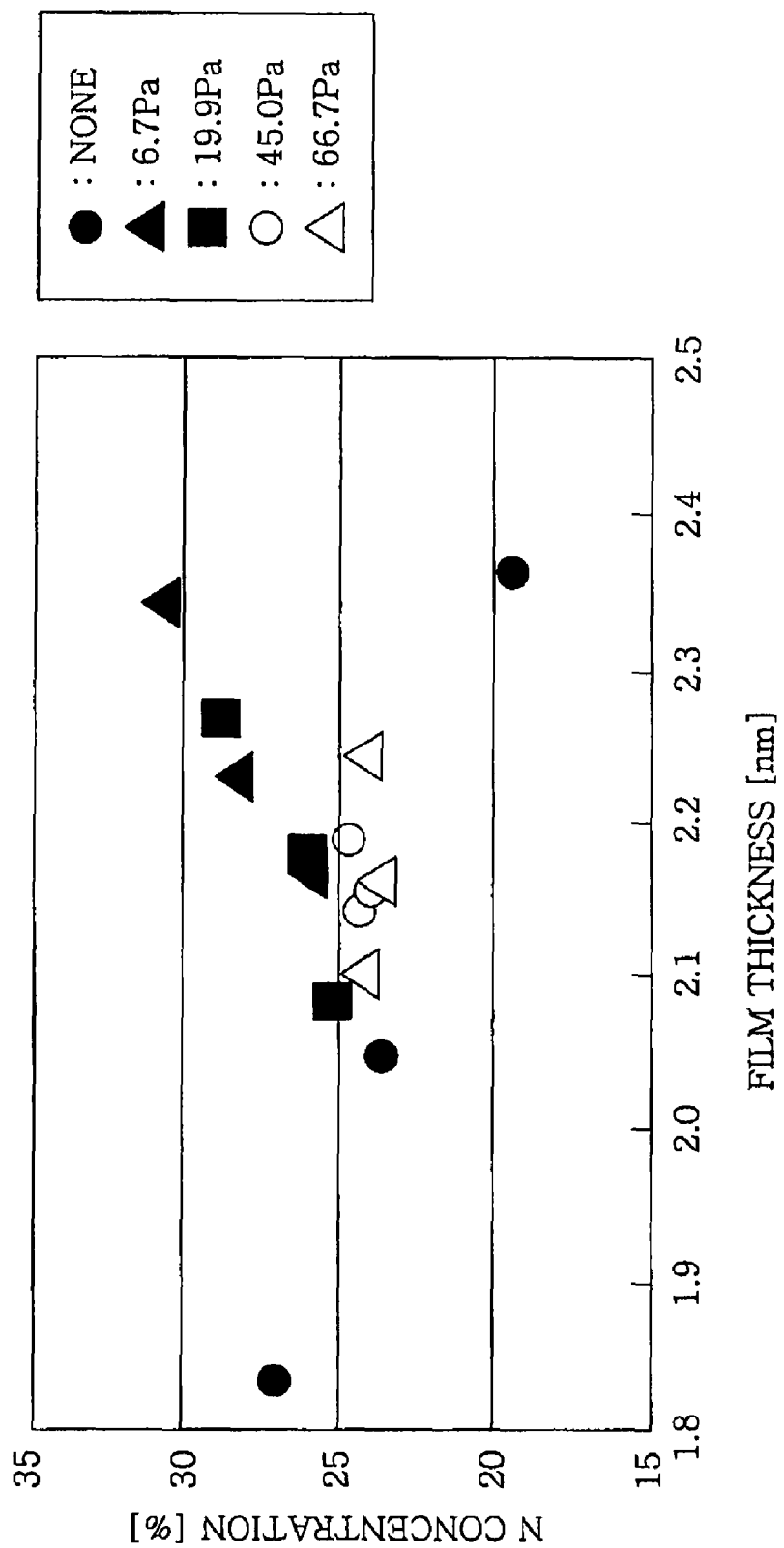
FIG. 17 is a graph illustrating a relationship between film thicknesses of silicon oxynitride films and nitrogen concentrations in the films under different process pressures.

FIG. 17 illustrates a relationship between film thicknesses of silicon oxynitride films and nitrogen concentrations in the films in XPS analysis. In FIG. 17, 'none' means that the processes of steps S1 and S2 shown in FIG. 1 were carried out, but the process of step S3 of FIG. 1 was not carried out.

Figure 18A:
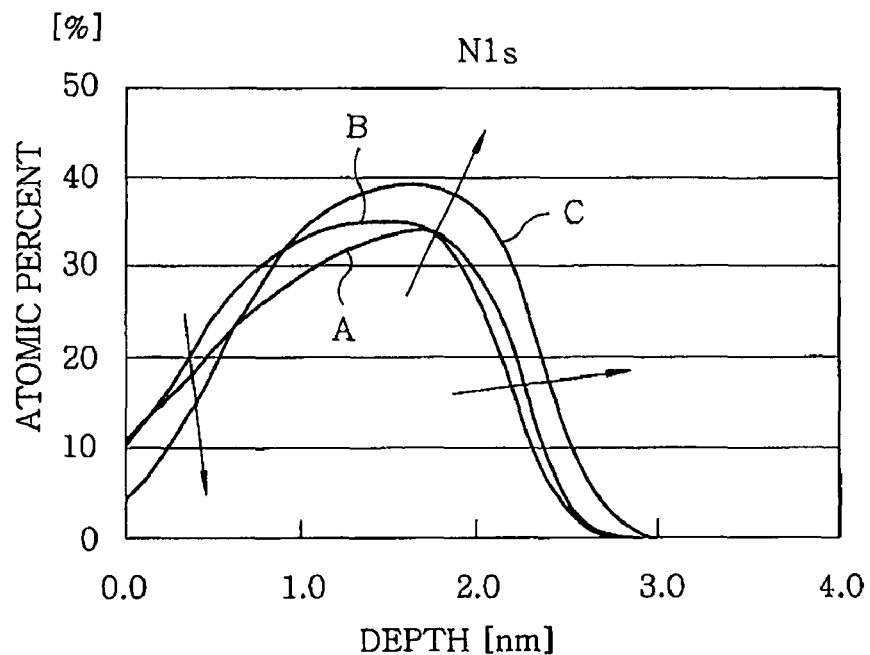
FIG. 18A is a graph illustrating profiles of concentration of nitrogen atoms (N1s) in the film thickness direction under respective formation conditions of silicon oxynitride films.
Figure 18B:
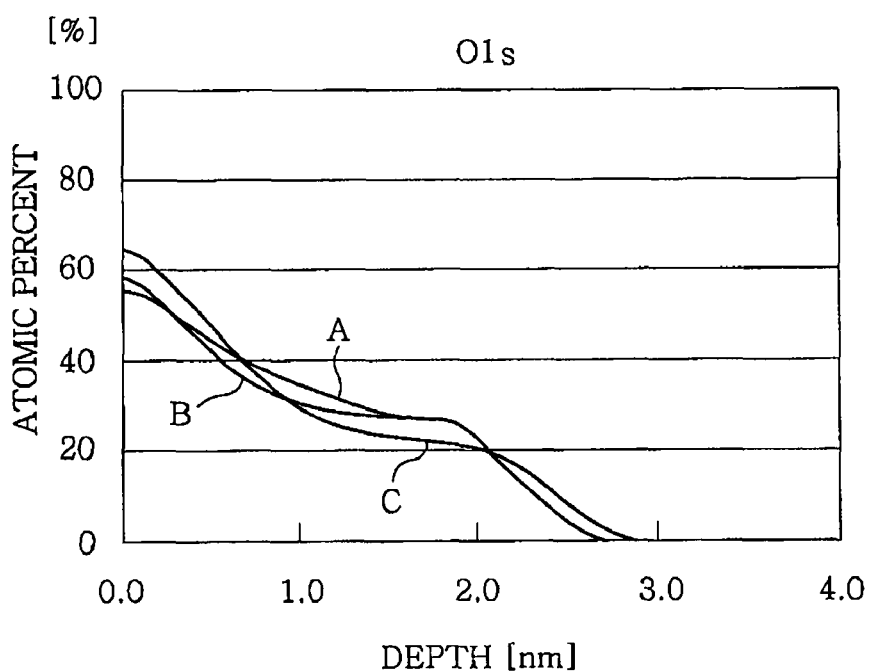
FIG. 18B is a graph illustrating profiles of concentration of oxygen atoms (O1s) in the film thickness direction under the respective formation conditions of the silicon oxynitride films.
Figure 18C:
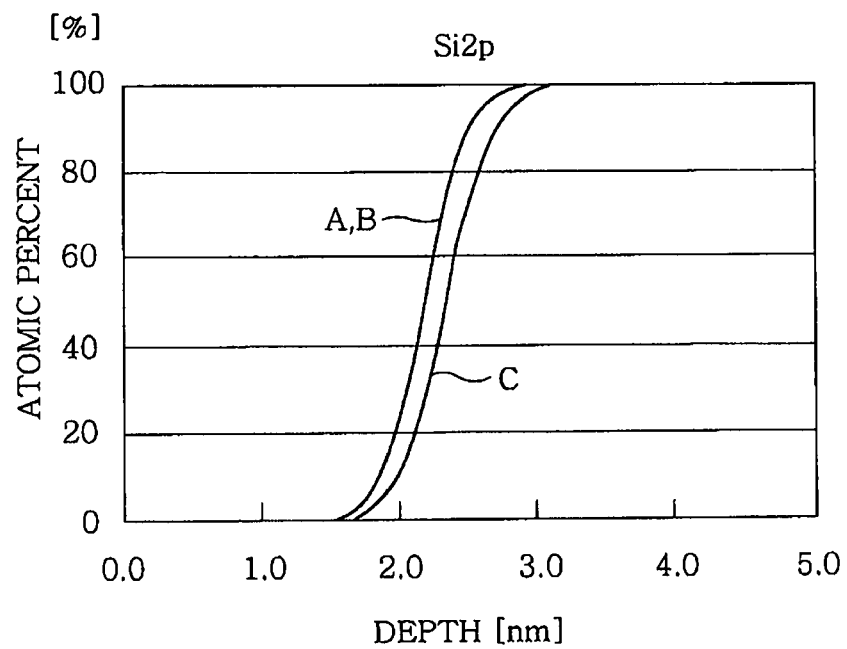
FIG. 18C is a graph illustrating profiles of concentration of silicon atoms (Si2p) in the film thickness direction under the respective formation conditions of the silicon oxynitride films.

Further, FIGS. 18A to 18C respectively illustrate profiles of nitrogen atoms (N1s), oxygen atoms (O1s), and silicon atoms (Si2P) in the films. In FIGS. 18A to 18C, the curve A represents a case where the processes up to step S2 were carried out but the processes from step S3 were not carried out, the curve B represents a case where the second nitriding process of step S3 was carried out at a process pressure of 6.7 Pa (50 mTorr), and the curve C represents a case where the second nitriding process of step S3 was carried out at a process pressure of 66.7 Pa (500 mTorr).

From FIG. 17, it is proved that in the case where the second nitriding process of step S3 was carried out at a low pressure (e.g., 6.7 Pa), a nitrogen concentration was high at the same film thickness and film growth was suppressed, compared with the case where the second nitriding process of step S3 was carried out at a relatively high process pressure (e.g., 66.7 Pa). Further, from FIGS. 18A to 18C, it is confirmed that in the case where the second nitriding process of step S3 was carried out at a low process pressure (e.g., 6.7 Pa), a nitrogen concentration near the surface of the silicon oxynitride film was raised. Accordingly, the leakage current of a transistor using the silicon oxynitride film as a gate insulating film was more firmly prevented. Therefore, the nitriding process of step S3 is preferably carried out at a low pressure in a range between 0.133 and 66.7 Pa.

Next, effects of presence of the annealing process of step S4 and conditions in this annealing process on electrical characteristics of a transistor were examined. Insulating films (silicon oxynitride films) were formed by processing wafers W under conditions, stated below, and transistors were manufactured by using the insulating films as gate insulating films. Then, electrical characteristics of the transistors were examined.

<Pre-Treatment>

The pre-treatment was carried out with 1% dilute hydrofluoric acid (DHF) for 45 seconds.

<Nitriding (1)> (Step S1)

The plasma nitriding was carried out by using the plasma processing apparatus 100, as shown in FIG. 5, for 36 seconds under the condition that Ar gas and $N_2$ gas were used as process gases, the flow rates of Ar and $N_2$ were 1,000 mL/min (sccm) and 200 mL/min(sccm), the temperatures of the wafers W were kept at 600° C., the process pressure was 199.9 Pa (1,500 mTorr), and the microwave power was 1.5 kW. The obtained silicon nitride films had a film thickness ranging from 0.9 to 1.0 nm.

<Oxidation (A1)> (Step S2)

The thermal oxidation was carried out by using the heat treating unit 101, as shown in FIG. 9, under the condition that $N_2O$ gas was used as the process gas, the process pressure was 133.3 Pa (1 Torr), the flow rate of the process gas was 2,000 mL/min(sccm), the process temperature was 1,100° C., and the process time was 23 seconds.

<Oxidation (A2)> (Step S2)

The thermal oxidation was carried out by using the heat treating unit 101, as shown in FIG. 9, under the condition that $O_2$ gas was used as the process gas, the process pressure was 9,997.5 Pa (75 Torr), the flow rate of the process gas was 2,000 mL/min(sccm), the process temperature was 1,100° C., and the process time was 9 seconds.

<Nitriding (2)> (Step S3)

The plasma nitriding mainly upon the surfaces of the silicon oxynitride films was carried out by using the plasma processing apparatus 100, as shown in FIG. 5. In the plasma nitriding process, Ar gas and $N_2$ gas were used as process gases, the flow rates of Ar and $N_2$ were 1,000 mL/min(sccm) and 40 mL/min(sccm), the temperature of the wafers W was 600° C., the process pressure was set to 12 Pa (90 mTorr), the microwave power was 1.5 kW, and the process time was 23 seconds.

<Annealing (A1)> (Step S4)

The annealing was carried out by using the heat treating unit 101, as shown in FIG. 9, under the condition that $N_2$ gas was used as the process gas, the flow rate of $N_2$ gas was 2,000 mL/min(sccm), the process pressure was 133.3 Pa (1 Torr), the process temperature was 800° C., and the process time was 30 seconds.

<Annealing (A2)> (Step S4)

The annealing was carried out by using the heat treating unit 101, as shown in FIG. 9, under the condition that $N_2$ gas was used as the process gas, the flow rate of $N_2$ gas was 2,000 mL/min(sccm), the process pressure was 133.3 Pa (1 Torr), the process temperature was 1,000° C., and the process time was 30 seconds.

<Annealing (A3)> (Step S4)

The annealing was carried out by using the heat treating unit 101, as shown in FIG. 9, under the condition that $O_2$ gas and $N_2$ gas were used as the process gases, the flow rates of $O_2$ gas and $N_2$ were 100 mL/min(sccm) and 1,900 mL/min (sccm), the process pressure was 133.3 Pa (1 Torr), the process temperature was 1,100° C., and the process time was 30 seconds.

Test Example 1

The pre-treatment, the nitriding (1), and the oxidation (A2) were sequentially carried out (the processes from step S3 were not carried out).

Test Example 2

The pre-treatment, the nitriding (1), and the oxidation (A1) were sequentially carried out (the processes from step S3 were not carried out).

Test Example 3

The pre-treatment, the nitriding (1), the oxidation (A1), and the nitriding (2) were sequentially carried out (the process of step S4 was not carried out).

Test Example 4

The pre-treatment, the nitriding (1), the oxidation (A1), the nitriding (2), and the annealing (A1) were sequentially carried out.

Test Example 5

The pre-treatment, the nitriding (1), the oxidation (A1), the nitriding (2), and the annealing (A2) were sequentially carried out.

Test Example 6

The pre-treatment, the nitriding (1), the oxidation (A1), the nitriding (2), and the annealing (A3) were sequentially carried out.

Figure 19:
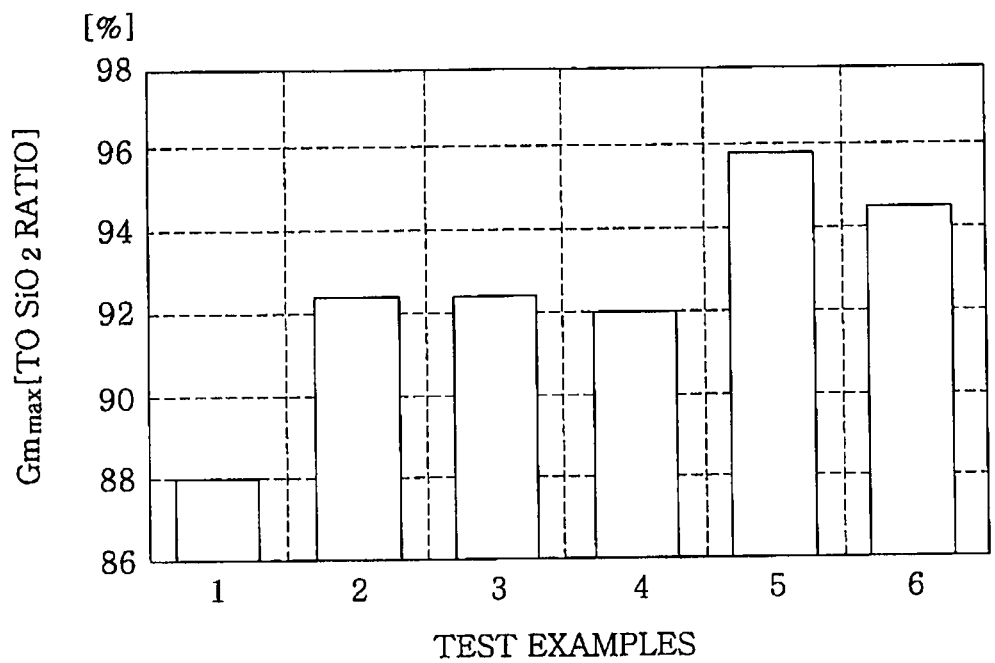
FIG. 19 is a graph illustrating the maximum values ($Gm_{max}$) of transconductances in respective test examples.
Figure 20:
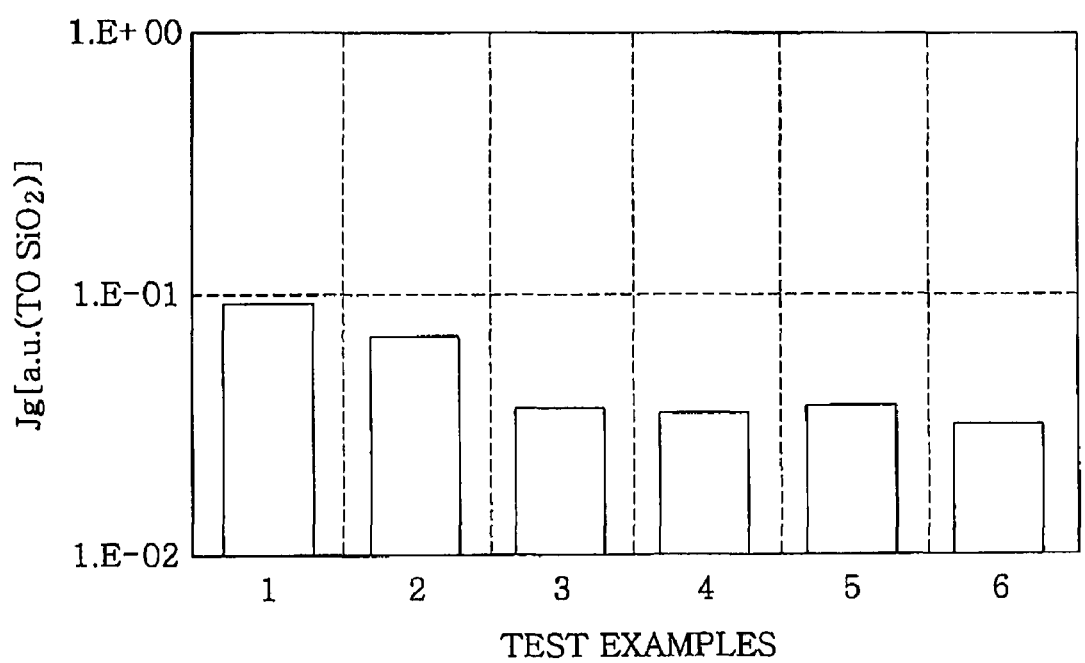
FIG. 20 is a graph illustrating gate leakage currents (Jg) in the respective test examples.

FIG. 19 illustrates the measurement results of the maximum values ($Gm_{max}$) of transconductances in the test examples 1 to 6, and FIG. 20 illustrates the measurement results of gate leakage currents (Jg) in the test examples 1 to 6. Further, the vertical axis of FIG. 19 represents the percents of the maximum values ($Gm_{max}$) of transconductances assuming that the maximum value ($Gm_{max}$) of transconductance of an NMOS transistor using a silicon oxide film ($SiO_2$ film) as an insulating film is 100%. Further, the vertical axis of FIG. 20 represents gate leakage currents (Jg) normalized with the gate leakage current (Jg) of the NMOS transistor using a silicon oxide film ($SiO_2$ film) as an insulating film.

In FIG. 19, by the comparison of the test examples 1 and 2, in which the processes from step S3 were not carried out, the test example 1, in which the thermal oxidation process of step S2 was carried out by using $O_2$, obtains the maximum value ($Gm_{max}$) of transconductance, which is much higher than that of the test example 2, in which the thermal oxidation process of step S2 was carried out by using $N_2O$, and is almost equal to that of the test example 3, in which the nitriding process of step S3 was carried out.

Further, by the comparison of the test example 3, in which the processes up to step S3 were carried out, and the test examples 4 to 6, in which the processes up to step S4 were carried out, the test example 4, in which the annealing was carried out at the temperature of 800° C. in the $N_2$ atmosphere, obtained the maximum value ($Gm_{max}$) of transconductance, being almost equal to that of the test example 3, in which the annealing was not carried out, and formed an insulating film having excellent electrical characteristics. Further, the test example 5 and the test example 6, in which the annealing of step S4 was carried out at the temperature of 1,000° C. or more, had the maximum value ($Gm_{max}$) of transconductance, which was drastically improved regardless of kinds of purge gas, and formed an insulating film having excellent electrical characteristics.

Further, from FIG. 20, it is confirmed that the test example 3, in which the processes up to step S3 were carried out, and the test examples 4 to 6, in which the processes up to step S4 were carried out, had low gate leakage current (Jg), compared with the test examples 1 and 2, in which the processes from the step S3 were not carried out, and thus suppressed leakage current and formed an insulating film having excellent electrical characteristics.

A high-k dielectric insulating film, made of at least one of $Al_2O_3$, HfSiO, $HfO_2$, $ZrO_2$, ZrSiO, RuO, $PrO_2$, and $DyO_2$, is formed on an insulating film made of the obtained silicon oxynitride film, and thus lowers an equivalent oxide thickness (EOT) and reduces leakage current. Thus, a gate insulating film of high reliability can be formed.

Further, the above embodiment of the present invention may be variously modified. Although the exemplary embodiment of the present invention has been disclosed for illustrative purposes, those skilled in the art will appreciate that various modifications, additions and substitutions are possible, without departing from the scope and spirit of the invention as disclosed in the accompanying claims.

For example, although the above embodiment uses the plasma processing apparatus 100 of an RLSA type in the first nitriding process (step S1), other plasma processing apparatuses, e.g., a plasma processing apparatus of a remote type, a plasma processing apparatus of an ICP type, a plasma processing apparatus of an ECR type, a plasma processing apparatus of a surface reflected wave type, a plasma processing apparatus of a CCP type, and a plasma processing apparatus of a magnetron type, or plasma processing apparatuses of these types including a plate having the same configuration as that of the plate 60 in the above apparatuses may be used.

INDUSTRIAL APPLICABILITY

The embodiment of the present invention is properly applied to the formation of a silicon nitride film by carrying out nitriding of silicon in the manufacture of various semiconductor devices.

What is claimed is:

1. A method for forming an insulating film, comprising:
preparing a substrate to be processed, in which silicon is exposed on a surface of the substrate;
performing a first nitriding process on the silicon to form a silicon nitride film having a film thickness ranging from 0.2 to 1 nm on a surface of the silicon; and
performing a first thermal process on the silicon nitride film in an atmosphere of a gaseous mixture containing $N_2O$ and $N_2$ or an $N_2O$ gas atmosphere to form a silicon oxynitride film,
wherein a flow rate of $N_2O$ gas ranges from 50 to 6,000 mL/min(sccm) and a flow rate of $N_2$ gas ranges from 0 to 3,000 mL/min(sccm).

2. The method of claim 1, further comprising performing a second nitriding process on the silicon oxynitride film, after the first thermal process is performed.

3. The method of claim 2, further comprising performing a second thermal process on the silicon oxynitride film, after the second nitriding process is performed.

4. The method of claim 1, wherein the first thermal process is performed at a temperature within a range between 1,000 and 1,200° C.

5. The method of claim 1, wherein the first nitriding process is performed by using a plasma of rare gas and gas containing nitrogen.

6. The method of claim 2, wherein the second nitriding process is performed by using a plasma of rare gas and gas containing nitrogen.

7. The method of claim 1, wherein the first nitriding process is performed by using a plasma containing nitrogen formed by introducing a microwave into a process chamber through a planar antenna having a plurality of slots.

8. The method of claim 7, wherein the first nitriding process is performed by interposing a dielectric plate having a plurality of through holes between the substrate placed in the process chamber and a plasma generating region.

9. The method of claim 2, wherein the second nitriding process is performed by using a plasma containing nitrogen formed by introducing a microwave into a process chamber through a planar antenna having a plurality of slots.

10. The method of claim 9, wherein the second nitriding process is performed by interposing a dielectric plate having a plurality of through holes between the substrate to be processed loaded in the process chamber and a plasma generating region.

11. The method of claim 1, wherein the first thermal process is performed at a process pressure ranging from 133.3 to 1,333 Pa, and a process temperature ranging from 900 to 1,200° C.

12. The method of claim 3, wherein the second thermal process is performed in an $N_2$ gas atmosphere, an $O_2$ gas atmosphere, or an atmosphere of a gaseous mixture containing $N_2$ and $O_2$.

13. The method of claim 12, wherein the second thermal process is performed at a process pressure ranging from 133.3 to 1,333 Pa, and a process temperature ranging from 800 to 1,200° C.

14. A method for manufacturing a semiconductor device, comprising:
 forming an insulating film including preparing a substrate to be processed, in which silicon is exposed on a surface of the substrate, performing a nitriding process on the silicon to form a silicon nitride film having a film thickness ranging from 0.2 to 1 nm on a surface of the silicon, and performing a thermal process on the silicon nitride film in an atmosphere of a gaseous mixture containing $N_2O$ and $N_2$ or an $N_2O$ gas atmosphere to form a silicon oxynitride film; and
 forming semiconductor device elements on the substrate,
 wherein a flow rate of $N_2O$ gas ranges from 50 to 6,000 mL/min(sccm) and a flow rate of $N_2$ gas ranges from 0 to 3,000 mL/min(sccm).

15. A non-transitory storage medium, storing a program which runs on a computer and, when executed, controls a substrate processing system including a nitriding unit and a heat treating unit to perform a method for forming an insulating film, the method comprising:
 preparing a substrate to be processed, in which silicon is exposed on a surface of the substrate;
 performing a nitriding process on the silicon to form a silicon nitride film having a film thickness ranging from 0.2 to 1 nm on a surface of the silicon; and
 performing a thermal process on the silicon nitride film in an atmosphere of a gaseous mixture containing $N_2O$ and $N_2$ or an $N_2O$ gas atmosphere to form a silicon oxynitride film,
 wherein a flow rate of $N_2O$ gas ranges from 50 to 6,000 mL/min(sccm) and a flow rate of $N_2$ gas ranges from 0 to 3,000 mL/min(sccm).

16. A substrate processing system comprising:
 a nitriding unit for performing a nitriding process on silicon of a substrate to be processed;
 a heat treating unit for performing a thermal process on the substrate; and
 a controller for controlling the nitriding unit and the heat treating unit such that the nitriding process is performed on silicon of the substrate, in which the silicon is exposed on a surface of the substrate, to form a silicon nitride film having a film thickness ranging from 0.2 to 1 nm on a surface of the silicon, and the thermal process is performed on the silicon nitride film in an atmosphere of a gaseous mixture containing $N_2O$ and $N_2$ or an $N_2O$ gas atmosphere to form a silicon oxynitride film,
 wherein a flow rate of $N_2O$ gas ranges from 50 to 6,000 mL/min(sccm) and a flow rate of $N_2$ gas ranges from 0 to 3,000 mL/min(sccm).

* * * * *